(12) United States Patent
Goda et al.

(10) Patent No.: US 8,208,278 B2
(45) Date of Patent: Jun. 26, 2012

(54) COUPLINGS WITHIN MEMORY DEVICES

(75) Inventors: Akira Goda, Boise, ID (US); Seiichi Aritome, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 277 days.

(21) Appl. No.: 12/637,163

(22) Filed: Dec. 14, 2009

(65) Prior Publication Data

US 2010/0091544 A1   Apr. 15, 2010

Related U.S. Application Data

(62) Division of application No. 11/405,762, filed on Apr. 18, 2006, now Pat. No. 7,633,786.

(51) Int. Cl.
 *G11C 5/06* (2006.01)
(52) U.S. Cl. ............... 365/63; 365/205; 365/189.02
(58) Field of Classification Search .......... 365/190, 365/63, 205, 189.02
See application file for complete search history.

(56) References Cited

U.S. PATENT DOCUMENTS

| 5,280,441 | A | | 1/1994 | Wada et al. |
| 5,596,538 | A | * | 1/1997 | Joo ............................ 365/201 |
| 6,084,820 | A | | 7/2000 | Raszka |
| 6,310,817 | B1 | * | 10/2001 | Kablanian ................ 365/230.04 |
| 6,738,279 | B1 | * | 5/2004 | Kablanian ..................... 365/72 |
| 7,095,658 | B2 | | 8/2006 | Cioaca |
| 7,184,290 | B1 | * | 2/2007 | Lee et al. ..................... 365/63 |
| 7,266,009 | B2 | * | 9/2007 | Chandler et al. ............. 365/145 |
| 7,633,786 | B2 | * | 12/2009 | Goda et al. .................... 365/63 |
| 8,023,334 | B2 | * | 9/2011 | Hoei et al. ............... 365/185.24 |

* cited by examiner

*Primary Examiner* — Pho M Luu
(74) *Attorney, Agent, or Firm* — Leffert Jay & Polglaze, P.A.

(57) ABSTRACT

A memory device includes a first bit line coupled to a first source/drain region of a first multiplexer gate, a second bit line coupled to a first source/drain region of a second multiplexer gate, and a sensing device having an input coupled to a second source/drain region of the first multiplexer gate and a second source/drain region of the second multiplexer gate. The input of the sensing device is formed at a vertical level that is different than a vertical level at which at least one of the first and second bit lines is formed.

19 Claims, 22 Drawing Sheets

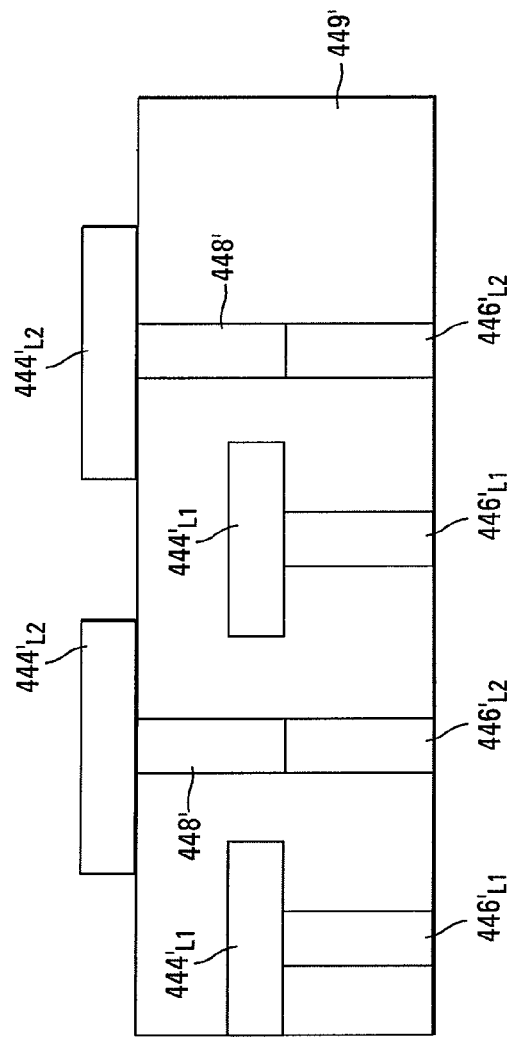
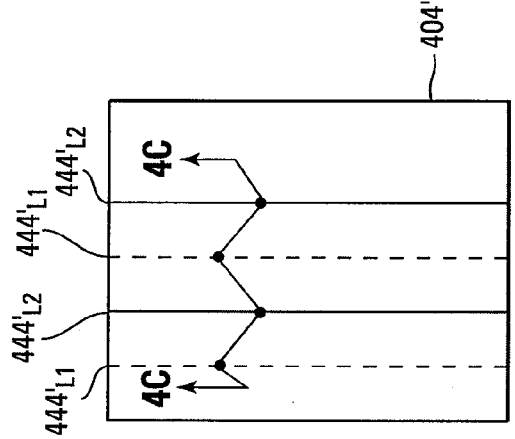

US 8,208,278 B2

COUPLINGS WITHIN MEMORY DEVICES

RELATED APPLICATION

This application is a divisional of U.S. application Ser. No. 11/405,762, titled "COUPLINGS WITHIN MEMORY DEVICES AND METHODS," filed Apr. 18, 2006 and issued as U.S. Pat. No. 7,633,786 on Dec. 15, 2009, which is commonly assigned and incorporated in its entirety herein by reference.

FIELD

The present invention relates generally to memory devices and in particular the present invention relates to couplings within memory devices and methods.

BACKGROUND

Memory devices are typically provided as internal storage areas in computers. The term memory identifies data storage that comes in the form of integrated circuit chips. In general, memory devices contain an array of memory cells for storing data, and row and column decoder circuits coupled to the array of memory cells for accessing the array of memory cells in response to an external address.

One type of memory is a non-volatile memory known as flash memory. A flash memory is a type of EEPROM (electrically-erasable programmable read-only memory) that can be erased and reprogrammed in blocks. Many modern personal computers (PCs) have their BIOS stored on a flash memory chip so that it can easily be updated if necessary. Such a BIOS is sometimes called a flash BIOS. Flash memory is also popular in wireless electronic devices because it enables the manufacturer to support new communication protocols as they become standardized and to provide the ability to remotely upgrade the device for enhanced features.

A typical flash memory comprises a memory array that includes a large number of memory cells arranged in row and column fashion. Each of the memory cells includes a floating-gate field-effect transistor capable of holding a charge. The cells are usually grouped into blocks. Each of the cells within a block can be electrically programmed on an individual basis by charging the floating gate. The charge can be removed from the floating gate by a block erase operation. The data in a cell is determined by the presence or absence of the charge on the floating gate.

Because memory devices typically contain millions, if not billions, of memory cells, it is common to have one or more levels of multiplexing in coupling memory cells to an input/output (DQ) line of the memory device. For example, target memory cells, may be selectively coupled to a first multiplexer through their associated bit lines. Outputs of the multiplexer are often provided to sensing devices, e.g., that sense the data values of the target memory cells and provide signals indicative of the data values on outputs. However, as processes improve to increase feature densities, bit lines become smaller and closer together that can lead to couplings between bit lines and a multiplexer and couplings between the multiplexer and a sensing device to become undesirably close. For example, high voltage differences that may occur between the bit-line-to-multiplexer couplings and the multiplexer-to-sensing-device couplings, e.g., during memory array erase operations, may cause the couplings to break down.

For example, FIG. 14 illustrates a portion of a typical prior art memory device. The memory device has a memory array 1404, such as a NAND memory array. Bit lines 1444 of memory array 1404 are coupled to a multiplexer 1410 that selectively couples bit lines 1444 to a sensing device 1416. Bit lines 1444 of memory array 1404 are typically formed at a single vertical level (or metal layer) of memory array 1404.

FIG. 15 is a plan view of multiplexer 1410 coupled to sensing circuits 1561 of sensing device 1416. Bit lines 1444 are typically coupled to multiplexer 1410 at the same vertical level (or metal layer) as each other, and sensing circuits 1561 are typically coupled to multiplexer 1410 at the same vertical level (or metal layer) as bit lines 1444.

Specifically, bit line $1444_1$ is coupled to a contact $1550_1$ that in turn couples bit line $1444_1$ to a first source/drain region of a multiplexer gate $1451_1$. Bit line $1444_2$ is coupled to a contact $1550_2$ that in turn couples bit line $1444_2$ to a first source/drain region of a multiplexer gate $1451_2$. A contact $1550_3$ couples a second source/drain region common to multiplexer gates $1451_1$ and $1451_2$ to a line $1510_1$ of multiplexer 1410. Line $1510_1$ couples contact $1550_3$ to sense circuit $1561_1$. Bit line $1444_{N-1}$ is coupled to a contact $1550_{N-2}$ that in turn couples bit line $1444_{N-1}$ to a first source/drain region of a multiplexer gate $1451_N$. Bit line $1444_N$ is coupled to a contact $1550_{N-1}$ that in turn couples bit line $1444_N$ to a first source/drain region of a multiplexer gate $1451_{N-1}$. A contact $1550_N$ couples a second source/drain region common to multiplexer gates $1451_{N-1}$ and $1451_N$ to a line $1510_N$ of multiplexer 1410. Line $1510_N$ couples contact $1550_N$ to sense circuit $1561_2$.

Note that bit lines 1444, lines 1510, and sense circuits 1561 are typically formed at a common vertical level. This can cause problems during erase operations performed on memory array 1404. For example, during an erase, a relatively high voltage, e.g., about 12 to about 20 volts is typically applied to bit lines 1444, while sensing circuits 1561, and thus lines 1510 are at about zero volts. This produces a large voltage difference between the bit lines 1444 and the lines 1510 at the circled regions 1560. When there is a small space between bit lines 1444 and the lines 1510 at the circled regions 1560, such as occurs when bit lines 1444, lines 1510, and sense circuits 1561 are at a common vertical level, breakdown problems can occur.

For the reasons stated above, and for other reasons stated below which will become apparent to those skilled in the art upon reading and understanding the present specification, there is a need in the art for alternative couplings between bit lines and multiplexers and between multiplexers and sensing devices.

BRIEF DESCRIPTION OF THE DRAWINGS

FIG. 4B is a plan view of a portion of a memory array, according to another embodiment of the invention.

FIG. 4C is a cross-sectional view of memory array taken along line 4C-4C of FIG. 4B.

DETAILED DESCRIPTION

Figure 1:
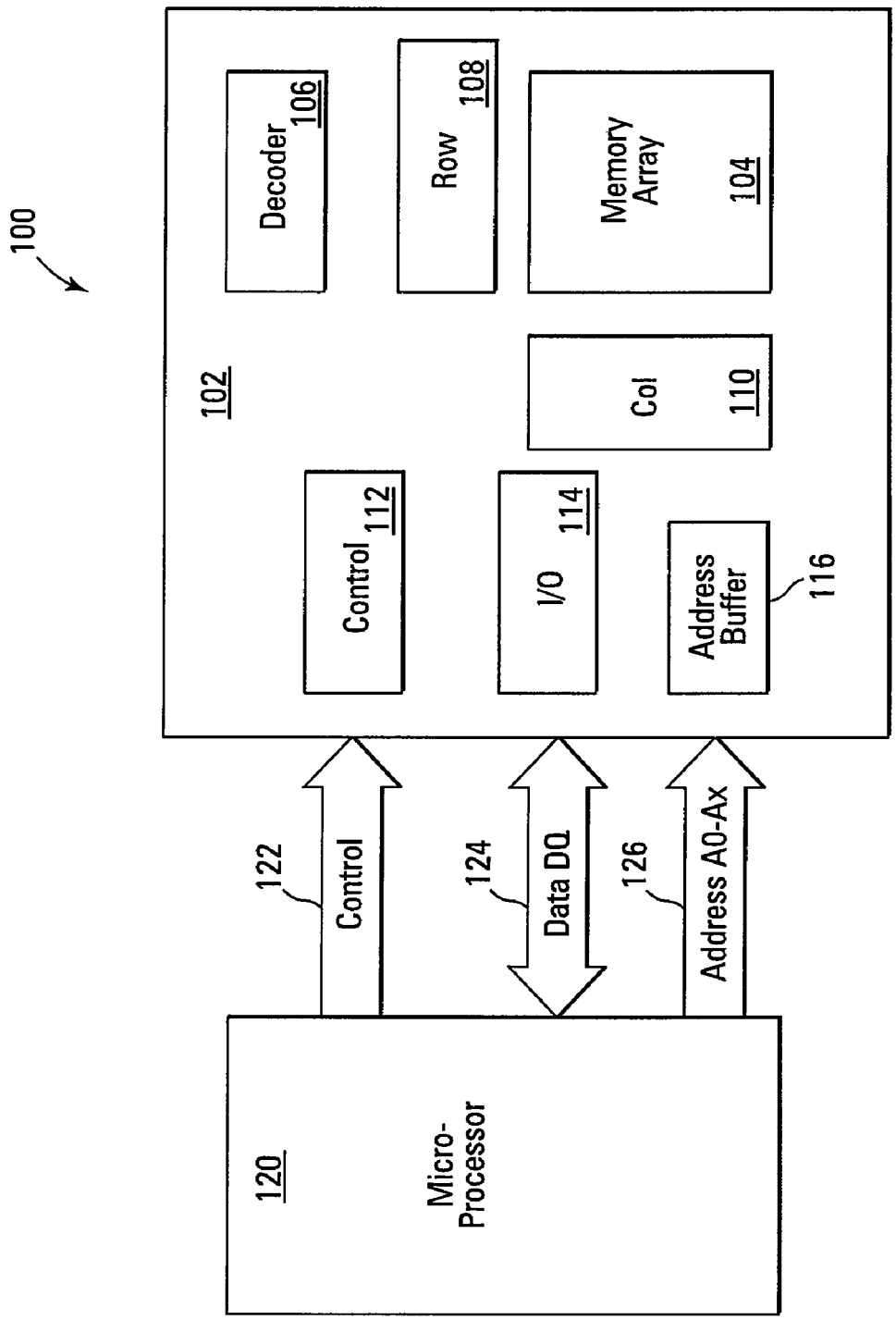
FIG. 1 is a simplified block diagram of a memory system, according to an embodiment of the invention.

In the following detailed description of the invention, reference is made to the accompanying drawings that form a part hereof, and in which is shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention. The term wafer or substrate used in the following description includes any base semiconductor structure. Both are to be understood as including silicon-on-sapphire (SOS) technology, silicon-on-insulator (SOI) technology, thin film transistor (TFT) technology, doped and undoped semiconductors, epitaxial layers of a silicon supported by a base semiconductor structure, as well as other semiconductor structures well known to one skilled in the art. Furthermore, when reference is made to a wafer or substrate in the following description, previous process steps may have been utilized to form regions/junctions in the base semiconductor structure, and terms wafer or substrate include the underlying layers containing such regions/junctions. The following detailed description is, therefore, not to be taken in a limiting sense, and the scope of the present invention is defined only by the appended claims and equivalents thereof.

FIG. 1 is a simplified block diagram of a memory system 100, according to an embodiment of the invention. Memory system 100 includes an integrated circuit device, such as a flash memory device 102 that includes an array of flash memory cells 104, an address decoder 106, row access circuitry 108, column access circuitry 110, control circuitry 112, Input/Output (I/O) circuitry 114, and an address buffer 116. Memory device 102 may be a NAND, NOR, or NROM flash memory device, dynamic random access memory device (DRAMs), static random access memory device (SRAMs), or the like having structures formed in accordance with embodiments of the invention. Memory system 100 includes an external microprocessor 120, or memory controller, electrically selectively coupled to memory device 102 for memory accessing as part of an electronic system. The memory device 102 receives control signals from the processor 120 over a control link 122. The memory cells are used to store data that are accessed via a data (DQ) link 124. Address signals are received via an address link 126 that are decoded at address decoder 106 to access the memory array 104. Address buffer circuit 116 latches the address signals. The memory cells are accessed in response to the control signals and the address signals. It will be appreciated by those skilled in the art that additional circuitry and control signals can be provided, and that the memory device of FIG. 1 has been simplified to help focus on the invention.

For one embodiment, memory array 104 is a NOR flash memory array. A control gate of each memory cell of a row of the array is connected to a word line, and a drain region of each memory cell of a column of the array is connected to a bit line. The memory array for NOR flash memory devices is accessed by row access circuitry, such as the row access circuitry 108 of memory device 102, activating a row of floating gate memory cells by selecting the word line connected to their control gates. The row of selected memory cells then place their data values on the column bit lines by flowing a differing current, depending upon their programmed states, from a connected source line to the connected column bit lines.

For another embodiment, memory array 104 is a NAND flash memory array also arranged such that the control gate of each memory cell of a row of the array is connected to a word line. However, each memory cell is not directly connected to a column bit line by its drain region. Instead, the memory cells of the array are arranged together in strings (often termed NAND strings), e.g., of 32 each, with the memory cells connected together in series, source to drain, between a source line and a column bit line. The memory array for NAND flash memory devices is then accessed by row access circuitry, such as the row access circuitry 108 of memory device 102, activating a row of memory cells by selecting the word line connected to a control gate of a memory cell. In addition, the word lines connected to the control gates of unselected memory cells of each string are driven to operate the unselected memory cells of each string as pass transistors, so that they pass current in a manner that is unrestricted by their stored data values. Current then flows from the source line to the column bit line through each series connected string, restricted only by the selected memory cells of each string. This places the current-encoded data values of the row of selected memory cells on the column bit lines.

Figure 2:
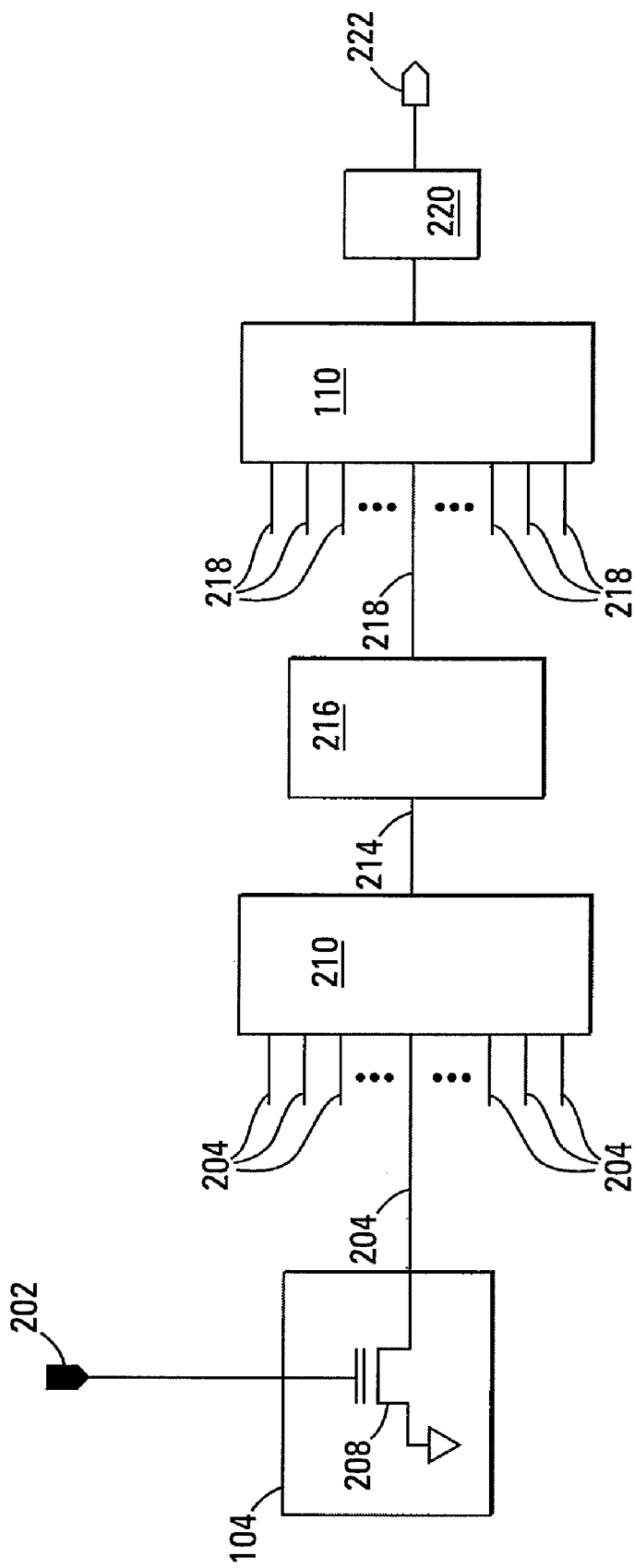
FIG. 2 is a block diagram of a portion of a memory device, according to another embodiment of the invention.

FIG. 2 is a block diagram of a portion of a memory device, such as memory device 102 of FIG. 1, according to another embodiment of the invention. Specifically, FIG. 2 illustrates an exemplary data path proceeding from the memory array 104 (FIG. 1) through the column access circuitry 110 (FIG. 1) to I/O circuitry, such as Input/Output (I/O) circuitry 114 of FIG. 1. Because memory devices typically contain millions, if not billions, of memory cells, it is common to have multiple levels of multiplexing in coupling a memory cell to a DQ line of the memory device.

As shown in FIG. 2, a target memory cell 208, e.g., a floating-gate memory cell, such as a floating-gate transistor, as part of memory array 104 (FIG. 1) is selectively coupled to a first multiplexer 210 through its associated bit line 204, along with bit lines 204 from a number of other memory cells (not shown in FIG. 2). As one example, a target memory cell 208 might be selectively coupled to the first multiplexer 210 upon activation of its word line 202 and an associated drain select gate (not shown in FIG. 2). The first multiplexer 210 may be configured to select one of every two or more bit lines in response to an address decoder (not shown in FIG. 2) and couple it to an output 214. For one embodiment, bit lines 204 may include a first portion of bit lines located at a first vertical level above a semiconductor substrate of memory array 104 and a second portion of bit lines located at a second vertical level, different from the first vertical level, above the semiconductor substrate.

The output 214 is provided to a sensing device 216. The sensing device 216 senses the data value of the target memory cell 208 and provides a signal indicative of its data value on its output 218. The output 218 of sensing device 216 is then provided to column decode circuitry 110 along with other outputs 218 from other sensing devices (not shown in FIG. 2). For one embodiment, sensing device 216 has a plurality of sensing circuits. For another embodiment, connections between bit lines 204 and multiplexer 210 and connections between the sensing circuits of sensing device 216 and multiplexer 210 are made according to various embodiments of the invention. Column decode circuitry 110 is configured to select one of a plurality of outputs 218 in response to an address decoder (not shown in FIG. 3) and couple it to an output latch 220 to place the data signal on the node 222, such as a DQ line, of the memory device. Note that the data path is generally bi-directional, and the output latch 220 generally also receives data values from the node 222 during a write operation to the memory device. Often, the data path includes two data signal legs, i.e., for carrying complementary logic levels. The column decode circuitry 110 includes comparison circuitry in accordance with an embodiment of the invention.

Figure 3:
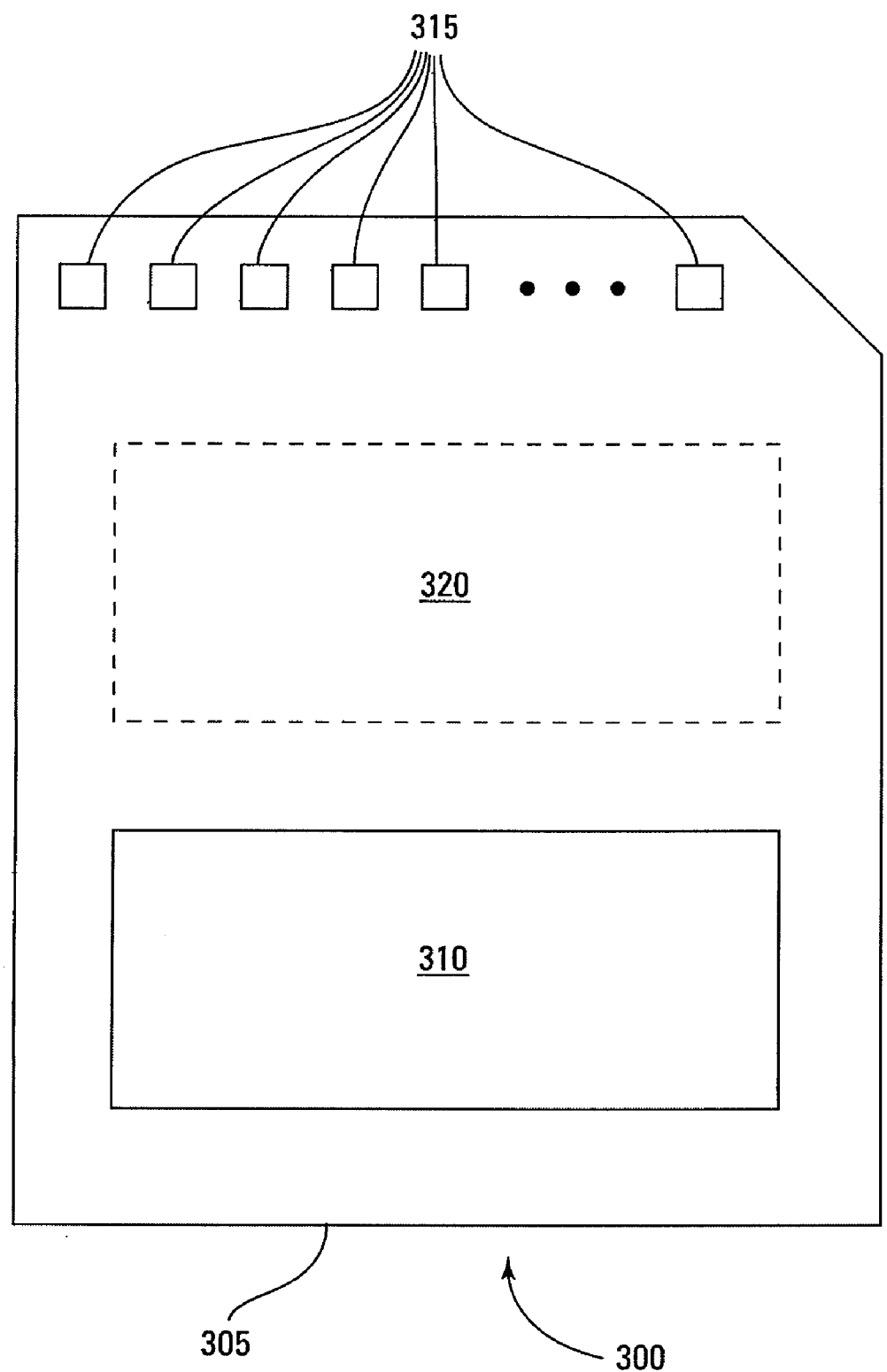
FIG. 3 is an illustration of an exemplary memory module, according to another embodiment of the invention.

FIG. 3 is an illustration of an exemplary memory module 300, according to another embodiment of the invention. Memory module 300 is illustrated as a memory card, although the concepts discussed with reference to memory module 300 are applicable to other types of removable or portable memory, e.g., USB flash drives, and are intended to be within the scope of "memory module" as used herein. In addition, although one example form factor is depicted in FIG. 3, these concepts are applicable to other form factors as well.

In some embodiments, memory module 300 will include a housing 305 (as depicted) to enclose one or more memory devices 310, though such a housing is not essential to all devices or device applications. At least one memory device 310 may be a NAND, NOR, or NROM flash memory device, dynamic random access memory device (DRAMs), static random access memory device (SRAMs), or the like having structures formed in accordance with embodiments of the invention. Where present, the housing 305 includes one or more contacts 315 for communication with a host device. Examples of host devices include digital cameras, digital recording and playback devices, PDAs, personal computers, memory card readers, interface hubs and the like. For some embodiments, the contacts 315 are in the form of a standardized interface. For example, with a USB flash drive, the contacts 315 might be in the form of a USB Type-A male connector. For some embodiments, the contacts 315 are in the form of a semi-proprietary interface, such as might be found on CompactFlash™ memory cards licensed by SanDisk Corporation, Memory Stick™ memory cards licensed by Sony Corporation, SD Secure Digital™ memory cards licensed by Toshiba Corporation and the like. In general, however, contacts 315 provide an interface for passing control, address, and/or data signals between the memory module 300 and a host having compatible receptors for the contacts 315.

The memory module 300 may optionally include additional circuitry 320 which may be one or more integrated circuits and/or discrete components. For some embodiments, the additional circuitry 320 may include a memory controller for controlling access across multiple memory devices 310 and/or for providing a translation layer between an external host and a memory device 310. For example, there may not be a one-to-one correspondence between the number of contacts 315 and a number of I/O connections to the one or more memory devices 310. Thus, a memory controller could selectively couple an I/O connection (not shown in FIG. 3) of a memory device 310 to receive the appropriate signal at the appropriate I/O connection at the appropriate time or to provide the appropriate signal at the appropriate contact 315 at the appropriate time. Similarly, the communication protocol between a host and the memory module 300 may be different than what is required for access of a memory device 310. A memory controller could then translate the command sequences received from a host into the appropriate command sequences to achieve the desired access to the memory device 310. Such translation may further include changes in signal voltage levels in addition to command sequences.

The additional circuitry 320 may further include functionality unrelated to control of a memory device 310 such as logic functions as might be performed by an ASIC (application specific integrated circuit). Also, the additional circuitry 320 may include circuitry to restrict read or write access to the memory module 300, such as password protection, biometrics or the like. The additional circuitry 320 may include circuitry to indicate a status of the memory module 300. For example, the additional circuitry 320 may include functionality to determine whether power is being supplied to the memory module 300 and whether the memory module 300 is currently being accessed, and to display an indication of its status, such as a solid light while powered and a flashing light while being accessed. The additional circuitry 320 may further include passive devices, such as decoupling capacitors to help regulate power requirements within the memory module 300.

Figure 4A:
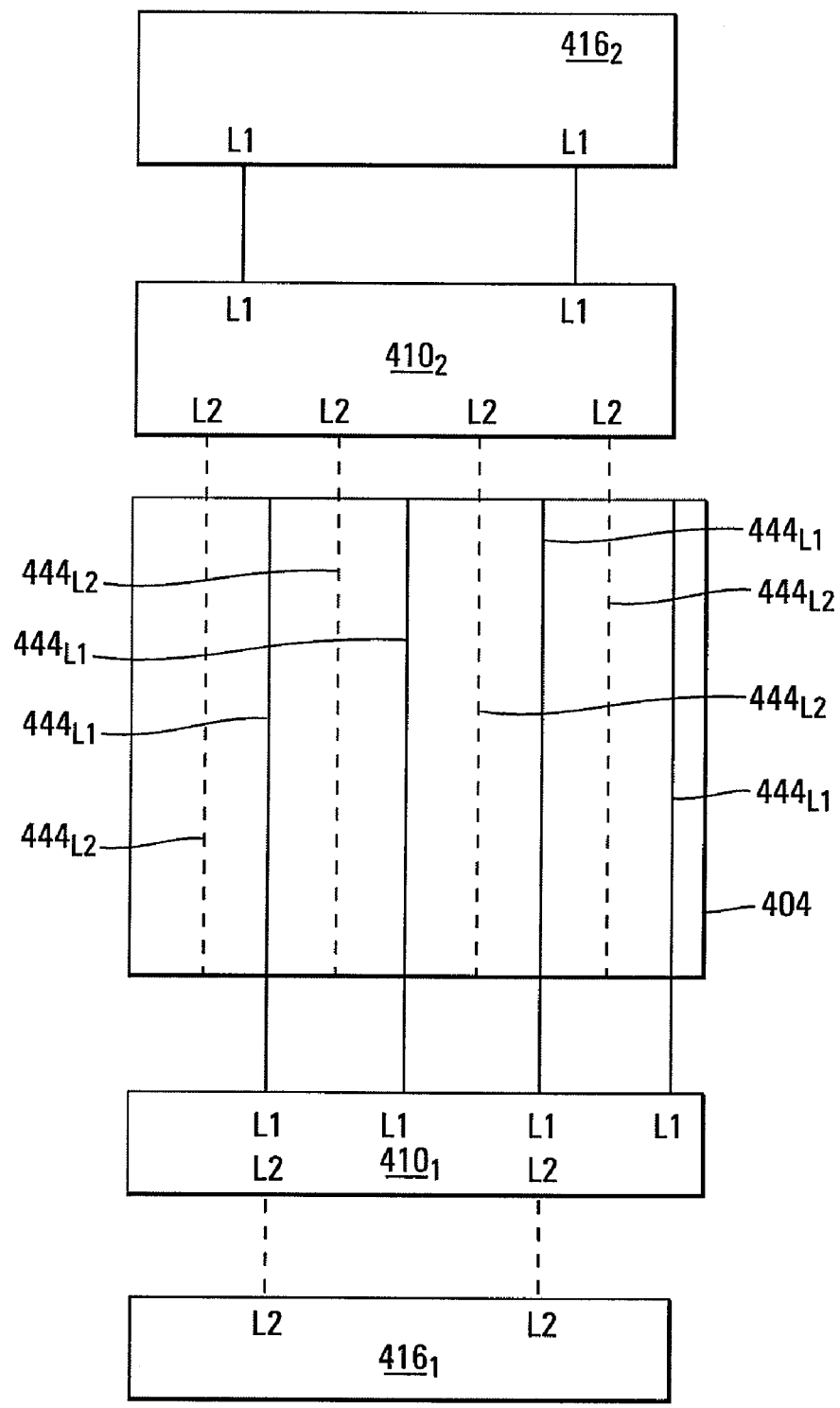
FIG. 4A illustrates a portion of a memory device, according to another embodiment of the invention.

FIG. 4A illustrates a portion of a memory device, such as memory device 102 of FIG. 1, according to another embodiment of the invention. For one embodiment, a memory array 404 of FIG. 4A may include bit lines $444_{L1}$ located at a first vertical level of memory array 404 and bit lines $444_{L2}$ located at a second vertical level, different from the first vertical level, of memory array 404. For example, the second vertical level may overlie the first vertical level.

Multiplexers 410 are coupled to bit lines 444 at either end of memory array 404. Specifically, the first vertical level bit lines $444_{L1}$ are coupled to a conductive layer, such as a wiring (or a metal) layer, located at a first vertical level L1 of multiplexer $410_1$ that corresponds to the first vertical level of memory array 404, and the second vertical level bit lines $444_{L2}$ are coupled to a conductive layer, such as a wiring (or a metal) layer, located at a second vertical level L2 of multiplexer $410_2$ that corresponds to the second vertical level of memory array 404. Note that for some embodiments, the wiring layer located at the first vertical level L1 of multiplexer $410_1$ coupled to the first vertical level bit lines $444_{L1}$ and the wiring layer located at the second vertical level L2 of multiplexer $410_2$ coupled to the second vertical level bit lines $444_{L2}$ are extensions or portions of the wiring layers of memory array 404 that defines the respective bit lines. A sensing device 416 is coupled to each of multiplexers 410. That is, inputs of a sensing device $416_1$ formed at the second vertical level are coupled to multiplexer $410_1$, and inputs of a sensing device $416_2$ formed at the first vertical level are coupled to multiplexer $410_2$. Specifically, the wiring (or a metal) layer located at the second vertical level L2 of multiplexer $410_1$ is coupled to sensing device $416_1$, and the wiring (or a metal) layer located at the first vertical level L1 of multiplexer $410_2$ is coupled to sensing device $416_2$. Note that for one embodiment, a sensing device 416 may include a plurality of sensing circuits and may be part of sensing device 216 of FIG. 2.

FIG. 4B is a plan view of a portion of a memory array 404', according to another embodiment of the invention. FIG. 4C is a cross-sectional view of memory array 404' taken along line 4C-4C of FIG. 4B. As shown in FIG. 4C, bit lines $444'_{L1}$ are formed at the first vertical level L1, and bit lines $444'_{L2}$ are formed at the second vertical level L2. Bit line contacts 446' are formed in a dielectric layer 449' and couple bit lines bit lines $444'_{L1}$ and bit lines $444'_{L2}$ to drain regions (not shown in FIG. 4C) of drain select gates, e.g., coupled to NAND strings of series coupled memory cells, for one embodiment, as is known in the art. For another embodiment, via plugs 448', formed in dielectric layer 449', couple bit lines $444'_{L2}$ to bit line contacts $446'_{L2}$, as shown in FIG. 4C.

Figure 4D:
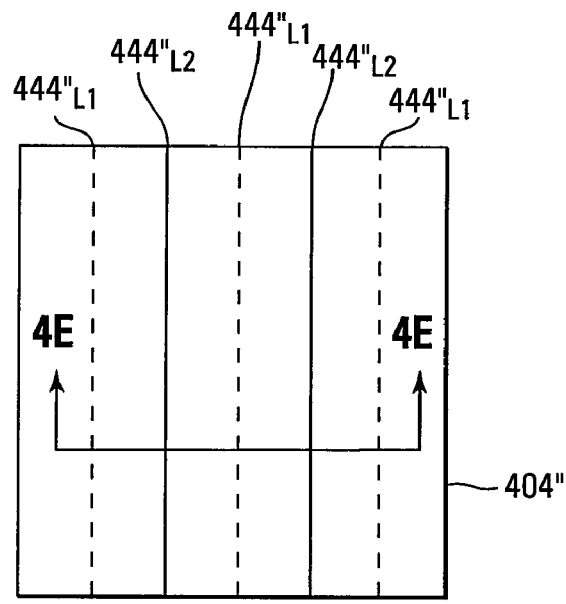
FIG. 4D is a plan view of a portion of a memory array, according to another embodiment of the invention.
Figure 4E:
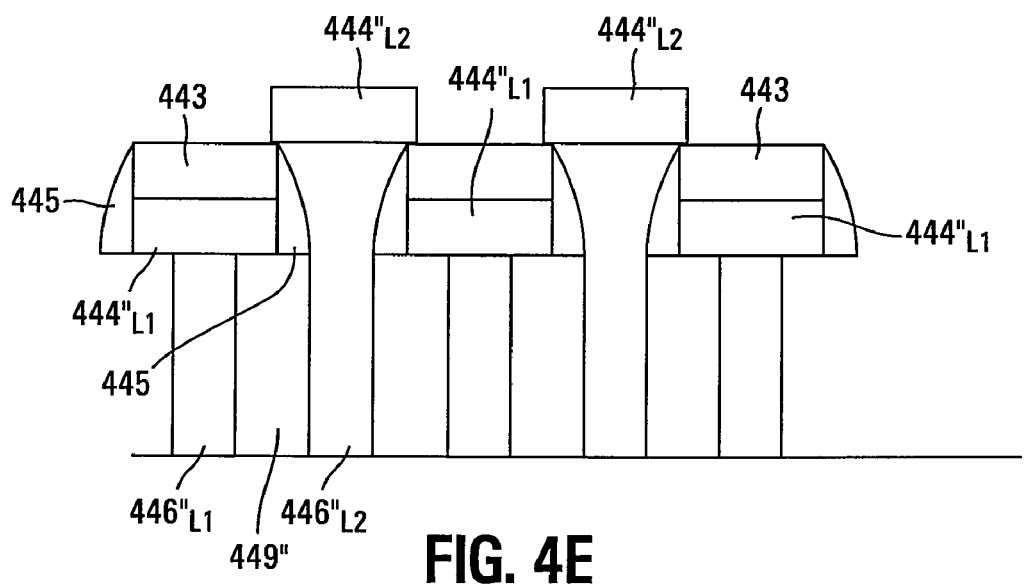
FIG. 4E is a cross-sectional view of memory array taken along line 4E-4E of FIG. 4D.

FIG. 4D is a plan view of a portion of a memory array 404", according to another embodiment of the invention. FIG. 4E is a cross-sectional view of memory array 404" taken along line 4E-4E of FIG. 4D. As shown in FIG. 4E, bit lines $444''_{L1}$ are formed at the first vertical level L1, and bit lines $444''_{L2}$ are formed at the second vertical level L2. Bit line contacts $446''_{L1}$ are formed in a dielectric layer 449" and couple bit lines bit lines $444''_{L1}$ to drain regions (not shown in FIG. 4E) of drain select gates, e.g., coupled to NAND strings of series coupled memory cells, for one embodiment, as is known in the art. For another embodiment, a dielectric layer 443, e.g., of silicon nitride, is formed on bit lines $444''_{L1}$, and spacers 445 of dielectric material, e.g., silicon nitride, are formed on sidewalls of dielectric layer 443 and bit lines $444''_{L1}$, as shown in FIG. 4E. Bit line contacts $446''_{L2}$ are formed between the spacers 445 of successive bit lines $444''_{L1}$ and couple bit lines $444''_{L2}$ to drain regions (not shown in FIG. 4E) of drain select gates, e.g., coupled to NAND strings of series coupled memory cells, for one embodiment.

Figure 4F:
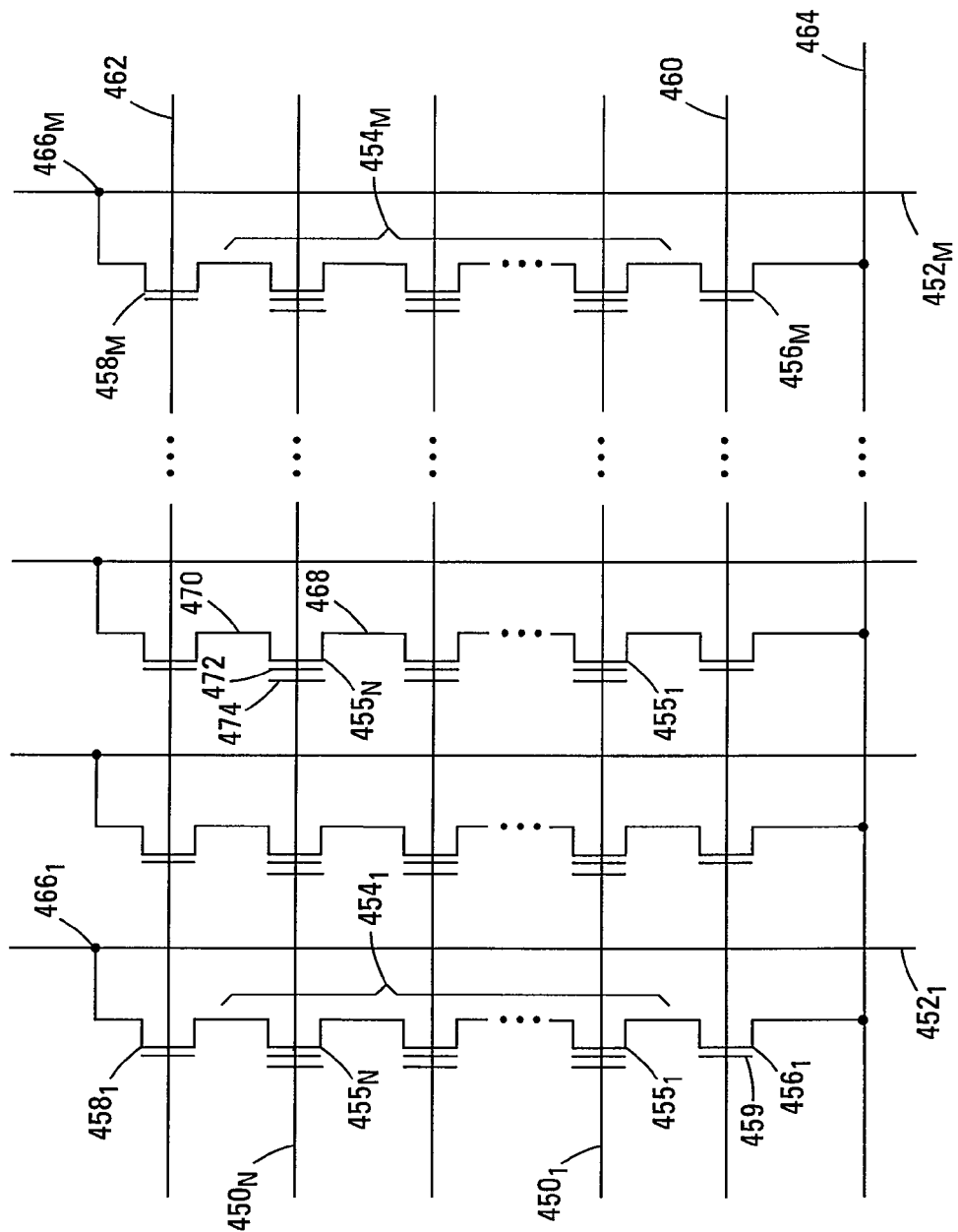
FIG. 4F is a schematic of a NAND memory array in accordance with another embodiment of the invention.

FIG. 4F is a schematic of a NAND memory array, such as memory array 404 of FIG. 4A, memory array 404' of FIG. 4B, or memory array 404" of FIG. 4D in accordance with another embodiment of the invention. As shown in FIG. 4F, the memory array includes word lines $450_1$ to $450_N$ and intersecting local bit lines $452_1$ to $452_M$. For ease of addressing in the digital environment, the number of word lines 450 and the number of bit lines 452 are each some power of two, e.g., 256 word lines 450 by 4,096 bit lines 452. The local bit lines 452 are coupled to global bit lines (not shown) in a many-to-one relationship.

The memory array includes NAND strings $454_1$ to $454_M$. Each NAND string includes floating-gate transistors $455_1$ to $455_N$, each located at an intersection of a word line 450 and a local bit line 452. The floating-gate transistors 455 represent non-volatile memory cells for storage of data. The floating-gate transistors 455 of each NAND string 454 are connected in series, source to drain, between a source select gate 456, e.g., a field-effect transistor (FET), and a drain select gate 458, e.g., an FET. Each source select gate 456 is located at an intersection of a local bit line 452 and a source select line 460, while each drain select gate 458 is located at an intersection of a local bit line 452 and a drain select line 462.

A source of each source select gate 456 is connected to a common source line 464. The drain of each source select gate 456 is connected to the source of the first floating-gate transistor 455 of the corresponding NAND string 454. For example, the drain of source select gate $456_1$ is connected to the source of floating-gate transistor $455_1$ of the corresponding NAND string $454_1$. A control gate 459 of each source select gate 456 is connected to source select line 460.

The drain of each drain select gate 458 is connected to a local bit line 452 for the corresponding NAND string at a drain contact 466. For example, the drain of drain select gate $458_1$ is connected to the local bit line $452_1$ for the corresponding NAND string $454_1$ at drain contact $466_1$. The source of each drain select gate 458 is connected to the drain of the last floating-gate transistor 455 of the corresponding NAND string 454. For example, the source of drain select gate $458_1$ is connected to the drain of floating-gate transistor $455_N$ of the corresponding NAND string $454_1$.

Typical construction of floating-gate transistors 455 includes a source 468 and a drain 470, a floating gate 472, and a control gate 474, as shown in FIG. 2. Floating-gate transistors 455 have their control gates 474 coupled to a word line 450. A column of the floating-gate transistors 455 are those NAND strings 454 coupled to a given local bit line 452. A row of the floating-gate transistors 455 are those transistors commonly coupled to a given word line 450.

Figure 5A:
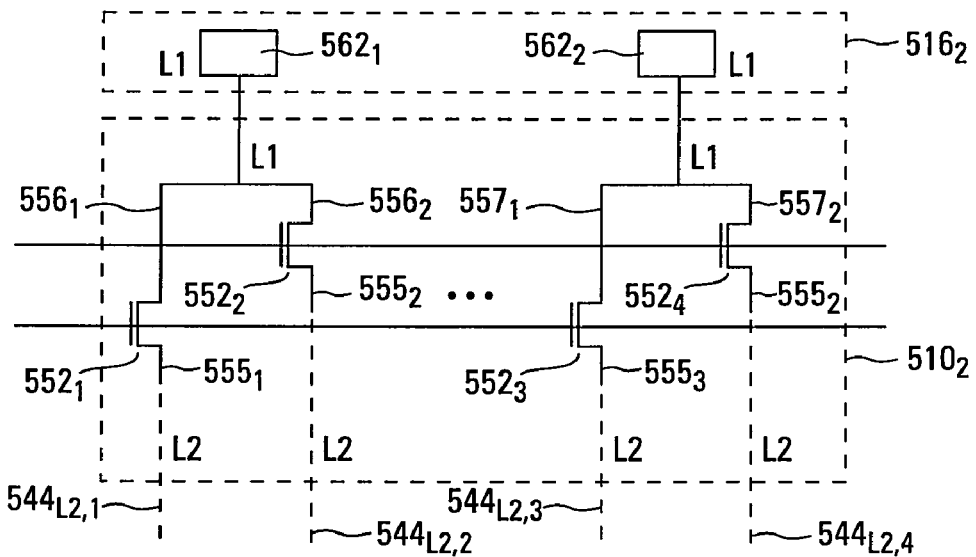
FIG. 5A is schematic diagram of an embodiment of a multiplexer, coupled to a sensing device, according to another embodiment of the invention.

FIG. 5A is a schematic diagram of a multiplexer $510_2$, such as a portion of multiplexer $410_2$ of FIG. 4, coupled to sensing device $516_2$, such as a portion of sensing device $416_2$ of FIG. 4, according to another embodiment of the invention. Bit lines $544_{L2,1}$ to $544_{L2,4}$, e.g., of a portion of memory array 404 of FIG. 4 and located at the second vertical level as denoted by the "L2" of the subscript, are respectively coupled to source/drain regions 555 of multiplexer gates $552_1$ to $552_4$, such as a field-effect transistors (FETs), of multiplexer $510_2$ by a wiring (or a metal) layer located at the second vertical level L2 of multiplexer $510_2$. Source/drain regions 556 of multiplexer gates $552_1$ and $552_2$ are coupled together. The wiring (or a metal) layer located at the first vertical level L1 of multiplexer $510_2$ couples source/drain regions 556 of multiplexer gates $552_1$ and $552_2$ to sensing circuit $562_1$, located at the first vertical level L1. Source/drain regions 557 of multiplexer gates $552_3$ and $552_4$ are coupled together and are coupled to sensing circuit $562_2$, located at the first vertical level L1, by the wiring (or a metal) layer located at the first vertical level L1 of multiplexer $510_2$. For one embodiment, multiplexer gates 552 are high-voltage multiplexer gates, e.g., that may receive voltages of about 20 volts.

Figure 5B:
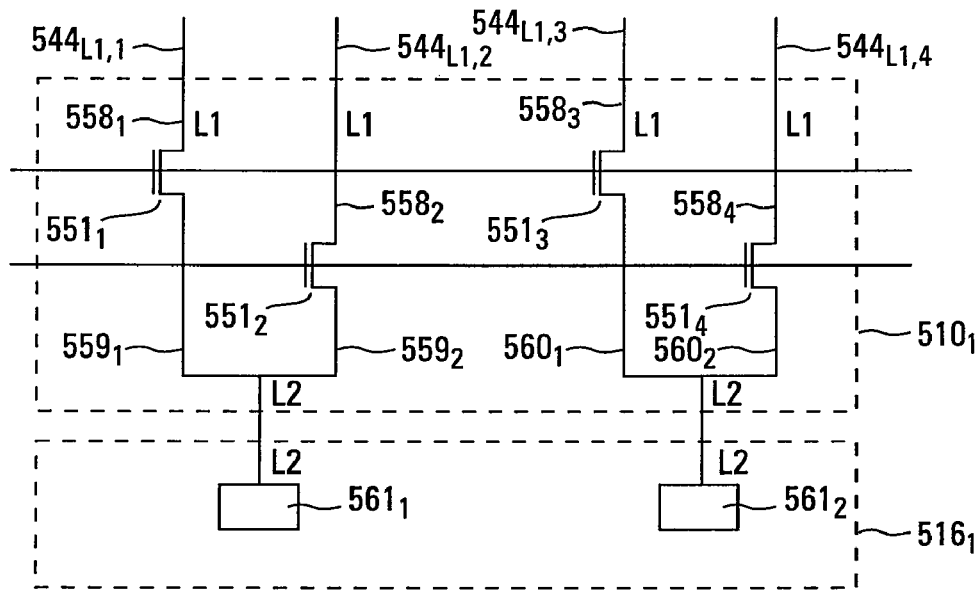
FIG. 5B is schematic diagram of another embodiment of a multiplexer, coupled to a sensing device, according to another embodiment of the invention.

FIG. 5B is a schematic diagram of a multiplexer $510_1$, such as a portion of multiplexer $410_1$ of FIG. 4, coupled to sensing device $516_1$, such as a portion of sensing device $416_1$ of FIG. 4, according to another embodiment of the invention. Bit lines $544_{L1,1}$ to $544_{L1,4}$, e.g., of a portion of memory array 404 of FIG. 4 and located at the first vertical level as denoted by the "L1" of the subscript, are respectively coupled to source/drain regions 558 of multiplexer gates $551_1$ to $551_4$, such as a field-effect transistors (FETs), of multiplexer $510_1$ by a wiring (or a metal) layer located at the first vertical level L1 of multiplexer $510_1$. Source/drain regions 559 of multiplexer gates $551_1$ and $551_2$ are coupled together. The wiring (or a metal) layer located at the second vertical level L2 of multiplexer $510_2$ couples source/drain regions 559 of multiplexer gates $551_1$ and $551_2$ to sensing circuit $561_1$, located at the second vertical level L2. Source/drain regions 560 of multiplexer gates $551_3$ and $551_4$ are coupled together and are coupled to sensing circuit $561_2$, located at the second vertical level L2, by the wiring (or a metal) layer located at the second vertical level L2 of multiplexer $510_1$. For one embodiment, multiplexer gates 551 are high-voltage multiplexer gates, e.g., that may receive voltages of about 20 volts.

Figure 6A:
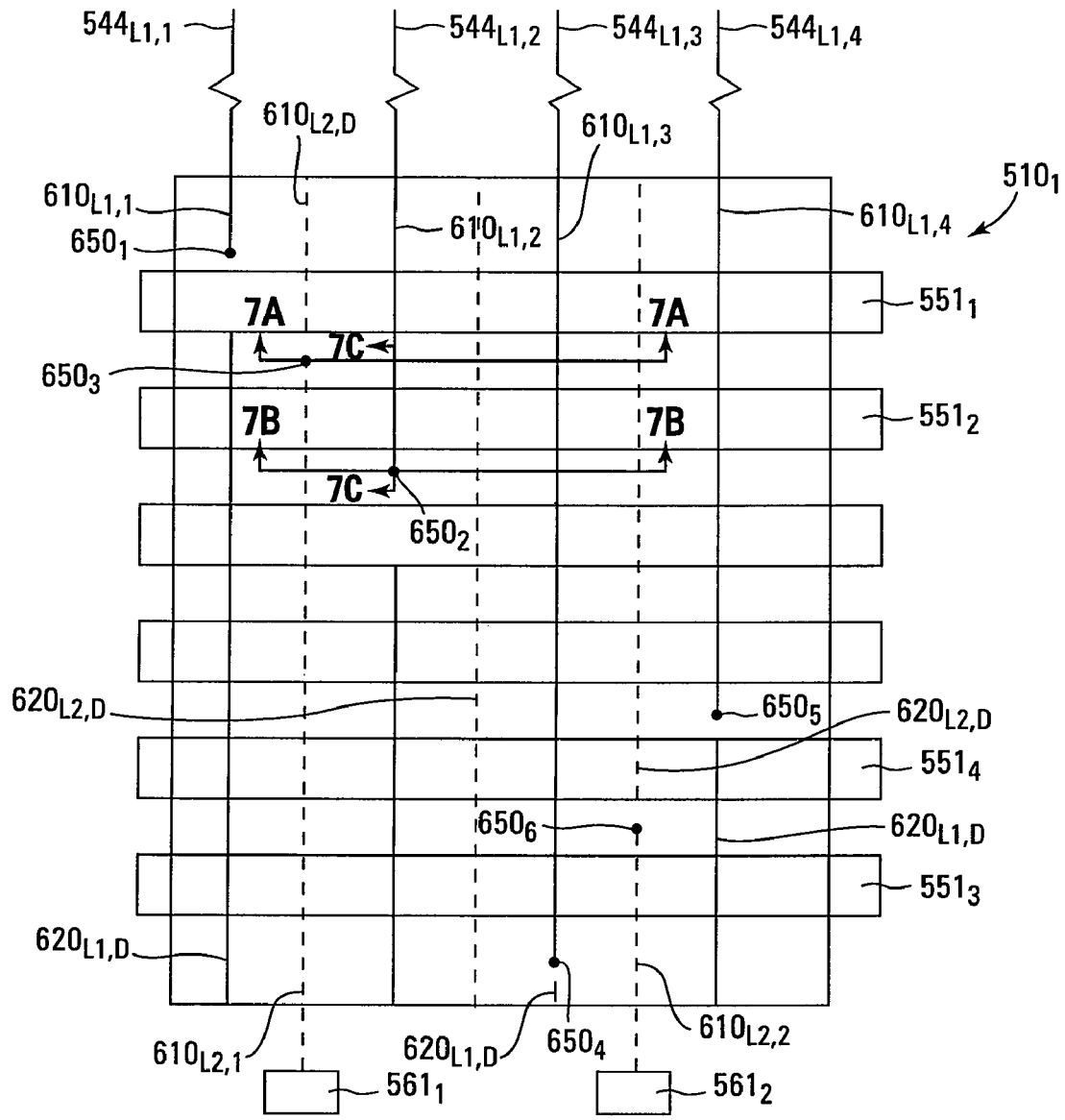
FIG. 6A is a plan view of a multiplexer, according to another embodiment of the invention.

FIG. 6A is a plan view of multiplexer $510_1$, according to another embodiment of the invention. The wiring (or metal) layer located at the first vertical level L1 defines lines $610_{L1,1}$ to $610_{L1,4}$, where the "L1" of the subscript denotes the first vertical level. Lines $610_{L1,1}$ to $610_{L1,4}$ are respectively coupled to bit lines $544_{L1,1}$ to $544_{L1,4}$. Note that for some embodiments, lines $610_{L1,1}$ to $610_{L1,4}$ are respectively extensions or portions of bit lines $544_{L1,1}$ to $544_{L1,4}$. For some embodiments, the wiring (or metal) layer located at the first vertical level L1 may also include optional "dummy" lines $620_{L1,D}$ that are not coupled to any bit lines, e.g., dummy" lines $620_{L1,D}$ correspond to bit lines formed at the first vertical level of the memory array, but are not coupled thereto, but can facilitate in the formation of the wiring (or metal) layer located at the first vertical level L1. The wiring (or metal) layer located at the second vertical level L2 defines lines $610_{L2,1}$ to $610_{L2,2}$, where the "L2" of the subscript denotes the second vertical level. Lines $610_{L2,1}$ to $610_{L2,2}$ are respectively coupled to sensing devices $561_1$ and $561_2$. For some embodiments, the wiring (or metal) layer located at the second vertical level L2 may also include optional "dummy" lines $620_{L2,D}$ that are not coupled to any bit lines, e.g., "dummy" lines $620_{L2,D}$ correspond to bit lines formed at the second vertical level of the memory array, but are not coupled thereto, but can facilitate in the formation of the wiring (or metal) layer located at the second vertical level L2.

Line $610_{L1,1}$ couples bit line $544_{L1,1}$ to a contact (or a via plug) $650_1$ that in turn couples line $610_{L1,1}$ to a source/drain region of multiplexer gate $551_1$. Line $610_{L1,2}$ couples bit line $544_{L1,2}$ to a contact (or a via plug) $650_2$ that in turn couples line $610_{L1,2}$ to the source/drain region of multiplexer gate $551_2$. A contact (or a via plug) $650_3$ is coupled to the coupled-together (or shared or common) source/drain regions of gates $551_1$ and $551_2$. Line $610_{L2,1}$ couples contact $650_3$ to sensing device $561_1$. Line $610_{L1,3}$ couples bit line $544_{L1,3}$ to a contact (or a via plug) $650_4$ that in turn couples line $610_{L1,3}$ to the source/drain region of multiplexer gate $551_3$. Line $610_{L1,4}$ couples bit line $544_{L1,4}$ to a contact (or a via plug) $650_5$ that in turn couples line $610_{L1,4}$ to the source/drain region of multiplexer gate $551_4$. A contact (or a via plug) $650_6$ is coupled to the coupled-together (or shared or common) source/drain regions of gates $551_3$ and $551_4$. Line $610_{L2,2}$ couples contact $650_6$ to sensing circuit $561_2$.

Figure 6B:
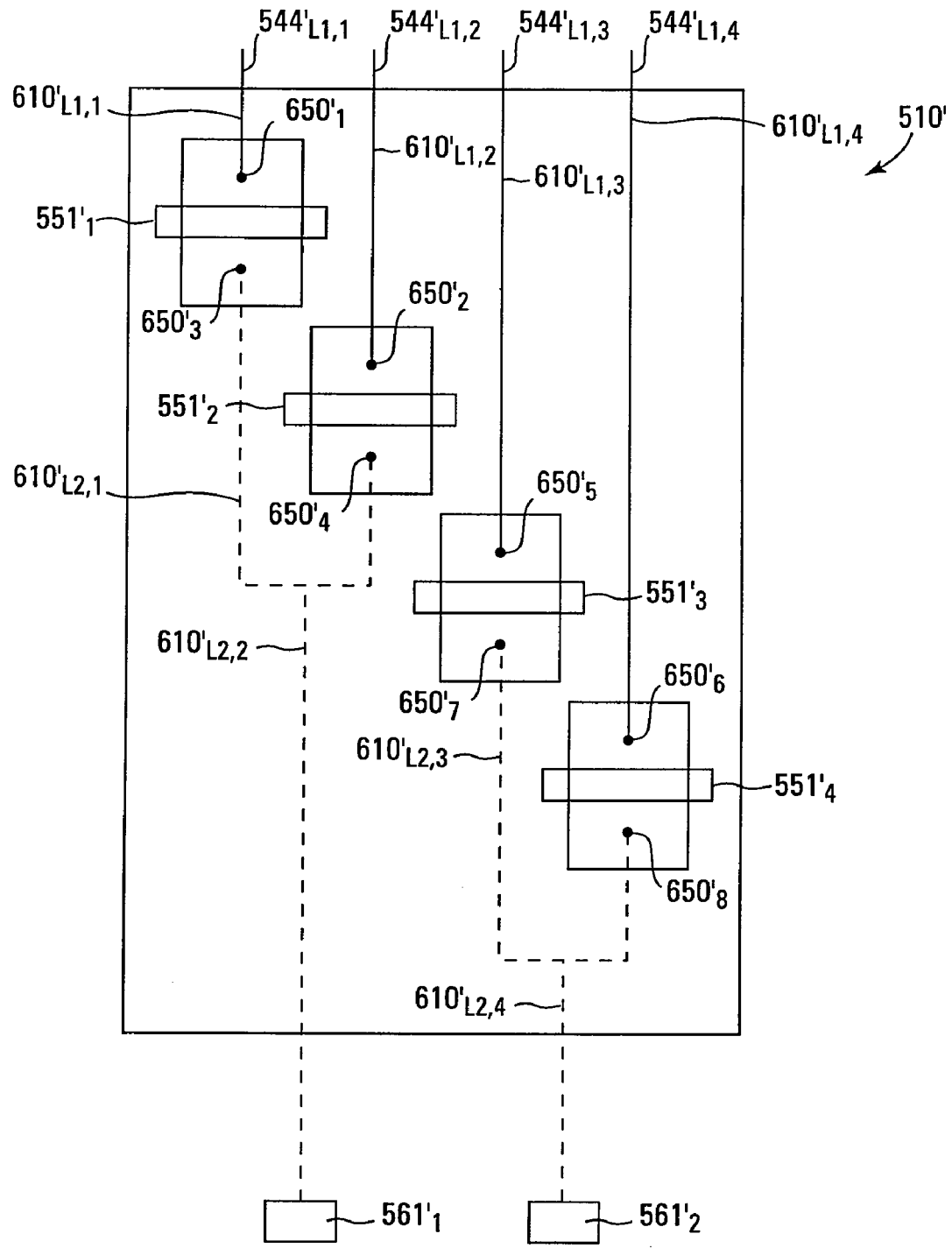
FIG. 6B is a plan view of a multiplexer, according to another embodiment of the invention.

FIG. 6B is a plan view of a multiplexer $510'$, according to another embodiment of the invention. The wiring (or metal) layer located at the first vertical level L1 defines lines $610'_{L1,1}$ to $610'_{L1,4}$, where the "L1" of the subscript denotes the first vertical level. Lines $610'_{L1,1}$ to $610'_{L1,4}$ are respectively coupled to bit lines $544'_{L1,1}$ to $544'_{L1,4}$. Note that for some embodiments, lines $610'_{L1,1}$ to $610'_{L1,4}$ are respectively extensions or portions of bit lines $544'_{L1,1}$ to $544'_{L1,4}$. The wiring (or metal) layer located at the second vertical level L2 defines lines $610'_{L2,1}$ to $610'_{L2,4}$, where the "L2" of the subscript denotes the second vertical level. Lines $610'_{L2,2}$ and $610^{L2,4}$ are respectively coupled to sensing devices $561'_1$ and $561'_2$.

Line $610'_{L1,1}$ couples bit line $544'_{L1,1}$ to a contact (or a via plug) $650'_1$ that in turn couples line $610'_{L1,1}$ to a first source/drain region of a multiplexer gate $551'_1$. Line $610'_{L1,2}$ couples bit line $544'_{L1,2}$ to a contact (or a via plug) $650'_2$ that in turn couples line $610'_{L1,2}$ to a first source/drain region of a multiplexer gate $551'_2$. Line $610'_{L2,1}$ couples contacts $650'_3$ and $650'_4$ together. Contacts $650'_3$ and $650'_4$ in turn respectively couple line $610'_{L2,1}$ to second source/drain regions of multiplexer gates $551'_1$ and $551'_2$. Line $610'_{L2,2}$ couples line $610'_{L2,1}$, and thus the second source/drain regions of multiplexer gates $551'_1$ and $551'_2$ to sensing device $561'_1$. Line $610'_{L1,3}$ couples bit line $544'_{L1,3}$ to a contact (or a via plug) $650'_5$ that in turn couples line $610'_{L1,3}$ to a first source/drain region of a multiplexer gate $551'_3$. Line $610_{L1,4}$ couples bit line $544'_{L1,4}$ to a contact (or a via plug) $650'_6$ that in turn couples line $610'_{L1,4}$ to a first source/drain region of a multiplexer gate $551'_4$. Line $610'_{L2,3}$ couples contacts $650'_7$ and $650'_8$ together. Contacts $650'_7$ and $650'_8$ in turn respectively couple line $610'_{L2,3}$ to second source/drain regions of multiplexer gates $551'_3$ and $551'_4$. Line $610'_{L2,4}$ couples line $610'_{L2,3}$, and thus the second source/drain regions of multiplexer gates $551'_3$ and $551'_4$ to sensing device $561'_2$. Note that for one embodiment, multiplexer gates $551'_1$ to $551'_4$ do not span the width of multiplexer $510'$.

Figure 6C:
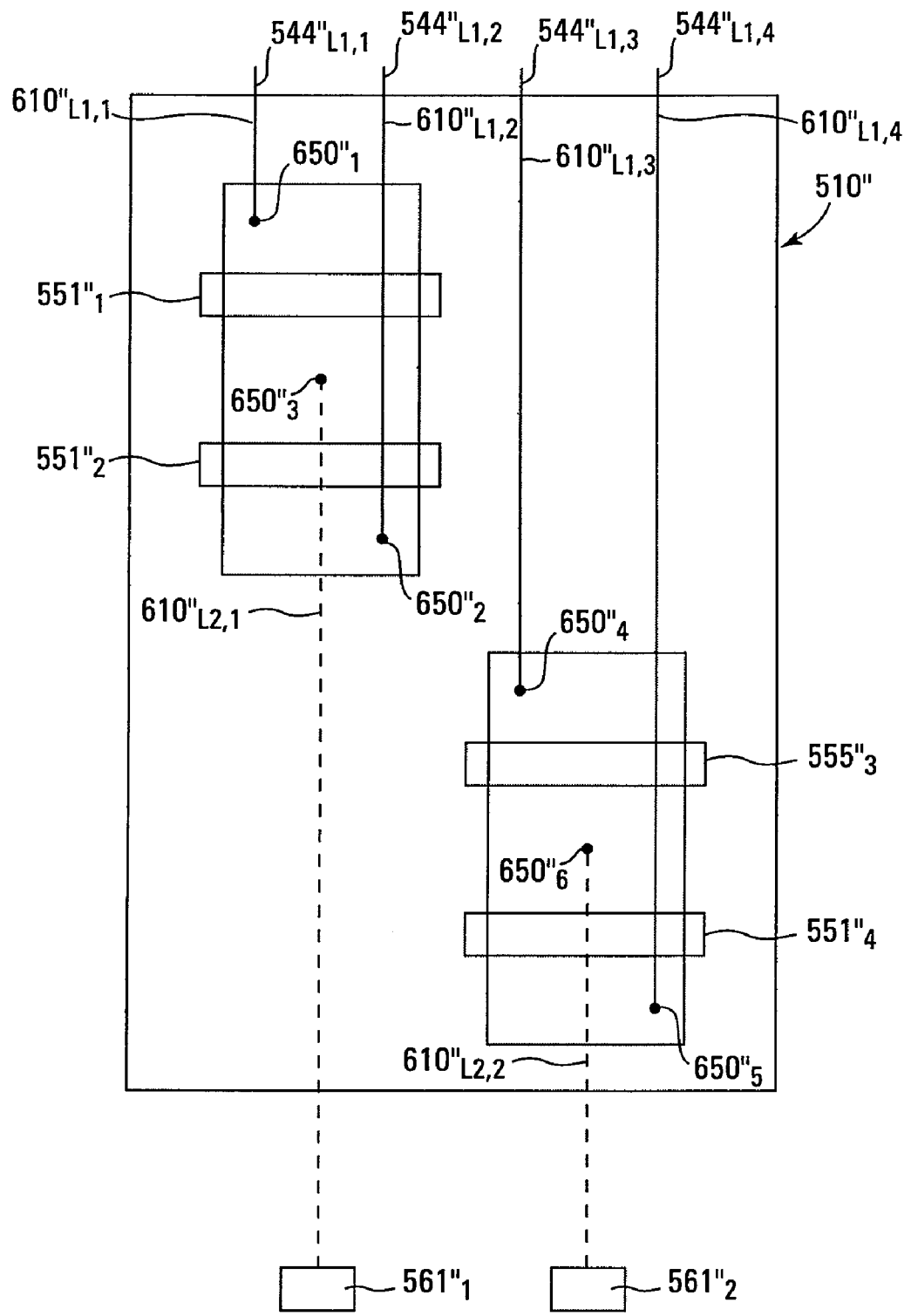
FIG. 6C is a plan view of a multiplexer, according to another embodiment of the invention.

FIG. 6C is a plan view of a multiplexer $510''$, according to another embodiment of the invention. The wiring (or metal) layer located at the first vertical level L1 defines lines $610''_{L1,1}$ to $610''_{L1,4}$, where the "L1" of the subscript denotes the first vertical level. Lines $610''_{L1,1}$ to $610''_{L1,4}$ are respectively coupled to bit lines $544''_{L1,1}$ to $544''_{L1,4}$. Note that for some embodiments, lines $610''_{L1,1}$ to $610''_{L1,4}$ are respectively extensions or portions of bit lines $544''_{L1,1}$ to $544''_{L1,4}$. The wiring (or metal) layer located at the second vertical level L2 defines lines $610''_{L2,1}$ and $610''_{L2,2}$, where the "L2" of the subscript denotes the second vertical level. Lines $610''_{L2,2}$ and $610''_{L2,4}$ are respectively coupled to sensing devices $561''_1$ and $561''_2$.

Line $610''_{L1,1}$ couples bit line $544''_{L1,1}$ to a contact (or a via plug) $650''_1$ that in turn couples line $610''_{L1,1}$ to a first source/drain region of multiplexer gate $551''_1$. Line $610''_{L1,2}$ couples bit line $544''_{L1,2}$ to a contact (or a via plug) $650''_2$ that in turn couples line $610''_{L1,2}$ to first source/drain region of multiplexer gate $551''_2$. A contact (or a via plug) $650''_3$ is coupled to shared (or common) second source/drain regions of gates $551''_1$ and $551''_2$. Line $610''_{L2,1}$ couples contact $650''_3$ to sensing device $561''_1$. Line $610''_{L1,3}$ couples bit line $544''_{L1,3}$ to a contact (or a via plug) $650''_4$ that in turn couples line $610''_{L1,3}$ to a first source/drain region of multiplexer gate $551''_3$. Line $610''_{L1,4}$ couples bit line $544''_{L1,4}$ to a contact (or a via plug) $650''_5$ that in turn couples line $610''_{L1,4}$ to a first source/drain region of multiplexer gate $551''_4$. A contact (or a via plug) $650''_6$ is coupled to shared (or common) second source/drain regions of gates $551''_3$ and $551''_4$. Line $610''_{L2,2}$ couples contact $650''_6$ to sensing circuit $561''_2$. Note that for one embodiment, multiplexer gates $551''_1$ to $551''_4$ do not span the width of multiplexer $510''$.

Figure 7A:
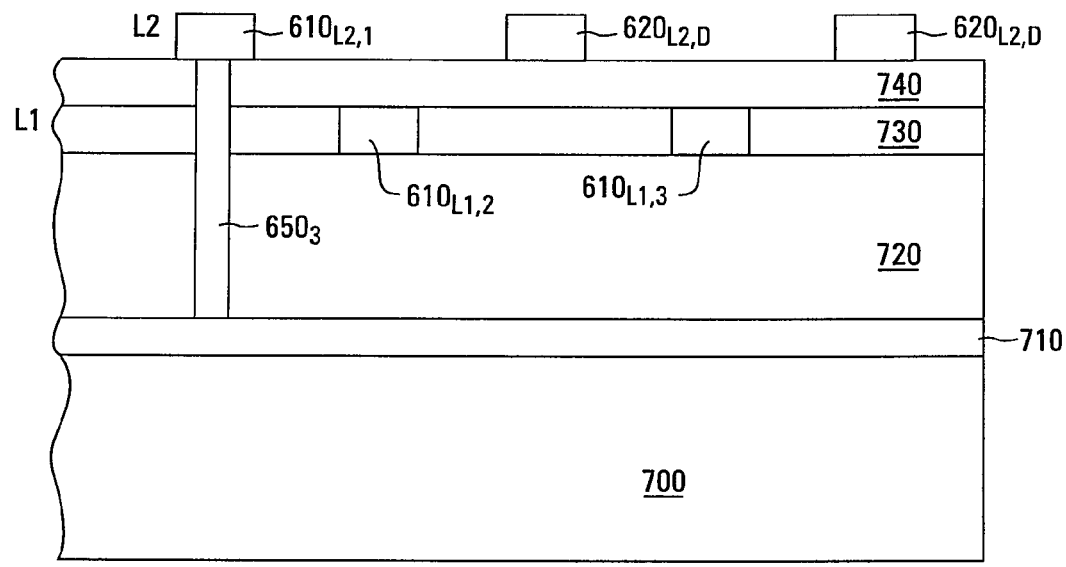
FIGS. 7A, 7B, and 7C are cross-sectional views respectively taken along line 7A-7A, line 7B-7B, and line 7C-7C of FIG. 6A, according to another embodiment of the invention.
Figure 7B:
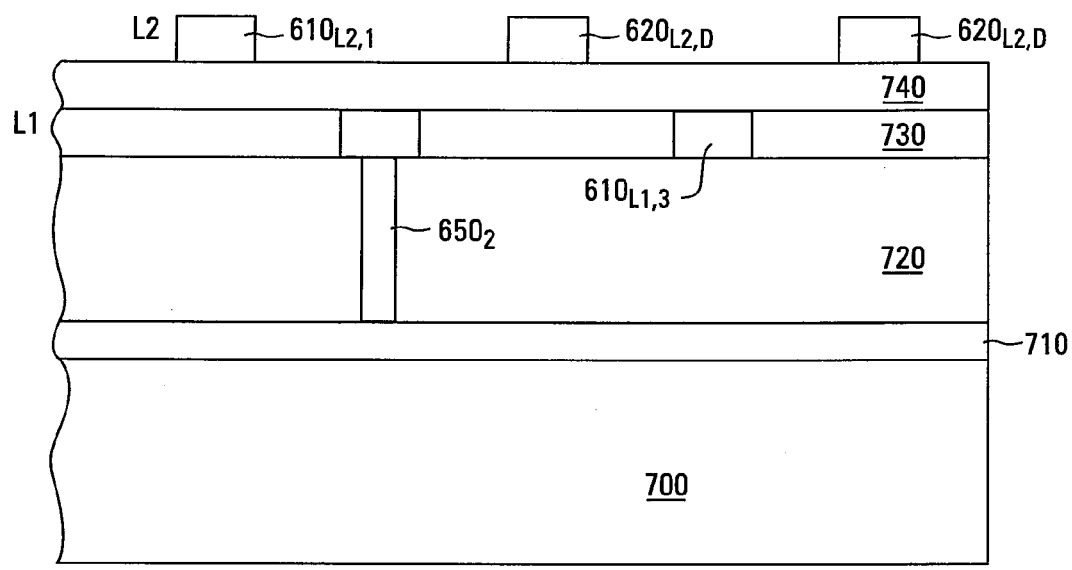
Figure 7C:
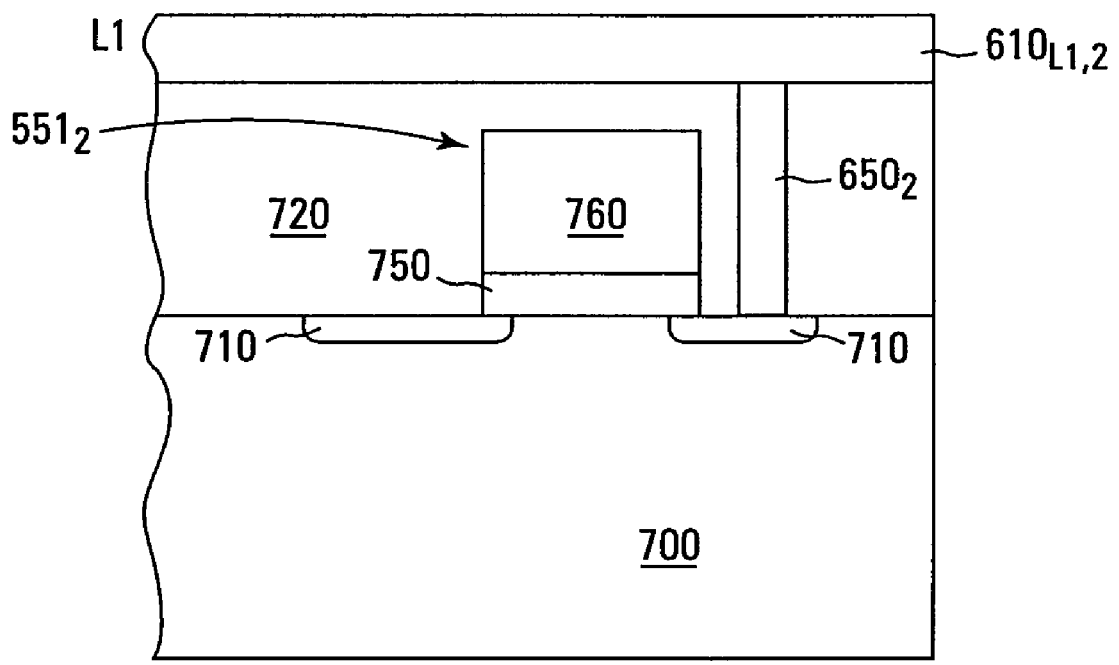

FIGS. 7A, 7B, and 7C are cross-sectional views respectively taken along line 7A-7A, line 7B-7B, and line 7C-7C of FIG. 6A. A source/drain region 710 is formed in a semiconductor substrate 700. A dielectric layer 720 is formed on source/drain region 710. As shown in FIG. 7A, line $610_{L1,2}$ is formed on dielectric layer 720 at the first vertical level L1. Contact (or a via plug) $650_2$ is formed through dielectric layer 720 and couples line $610_{L1,2}$ with source/drain region 710, as shown in FIG. 7B. A dielectric layer 730 is formed overlying dielectric layer 720 and line $610_{L1,2}$, and a dielectric layer 740 is formed on dielectric layer 730, as shown in FIGS. 7A and 7B. Line $610_{L2,1}$ is formed on dielectric layer 740 at the second vertical level L2, as shown in FIGS. 7A and 7B. Contact (or a via plug) $650_3$ is formed through dielectric layers 740, 730 and 720 and couples line $610_{L2,1}$ with source/ drain region 710. Note that for one embodiment, the first and second vertical levels overlie multiplexer gates 551, as shown in FIG. 7C for the first vertical level L1. Adjacent lines 610 respectively formed at the different vertical levels act to suppress the electric field that can form between adjacent lines 610 caused by a relatively large voltage difference that may occur between adjacent lines 610, e.g., during erase operations. For example, one of the adjacent lines 610 may be at about 20 volts during the erase, while the other of the adjacent lines 610 may be at about zero volts.

Examples for dielectric layers 720 and 730 would be a doped silicate glass, e.g., BSG (borosilicate glass), PSG (phosphosilicate glass), and BPSG (borophosphosilicate glass), tetraethyl orthosilicate (TEOS), etc. [What is an example of dielectric layer 740??] For one embodiment, contacts (or a via plugs) 650 may include one or more refractory metals. For another embodiment, the contacts 650 may include a barrier layer, such as TiN, in contact with source/drain region 710, a first metal layer, such as titanium (Ti), on the barrier layer, a second metal layer, such as tungsten (W), on the first metal layer. For one embodiment, lines 610 may be fabricated from aluminum, copper, or other suitable conductive material. For one embodiment, multiplexer gates 550 include a gate dielectric layer 750, such as gate oxide layer that can be blanket deposited or thermally grown, formed on substrate 700, as shown in FIG. 7C. A control gate layer 760 is formed on gate dielectric layer 750, e.g., using chemical vapor deposition (CVD) or physical vapor deposition (PVD) techniques. For one embodiment, control gate layer 760 is a metal or metal-containing layer and may be aluminum, copper, a refractory metal, or a refractory metal silicide layer. The metals of chromium (Cr), cobalt (Co), hafnium (Hf), molybdenum (Mo), niobium (Nb), tantalum (Ta), titanium (Ti), tungsten (W), vanadium (V) and zirconium (Zr) are generally recognized as refractory metals. For another embodiment, control gate layer 760 may contain multiple metal-containing layers, e.g., a titanium nitride (TiN) barrier layer, a titanium (Ti) adhesion layer overlying the barrier layer, and a tungsten (W) layer overlying the adhesion layer. For another embodiment, control gate layer 760 may include a layer of conductively doped polysilicon, interposed between the metal layer, metal-containing layer, or multiple metal-containing layers.

Figure 8A:
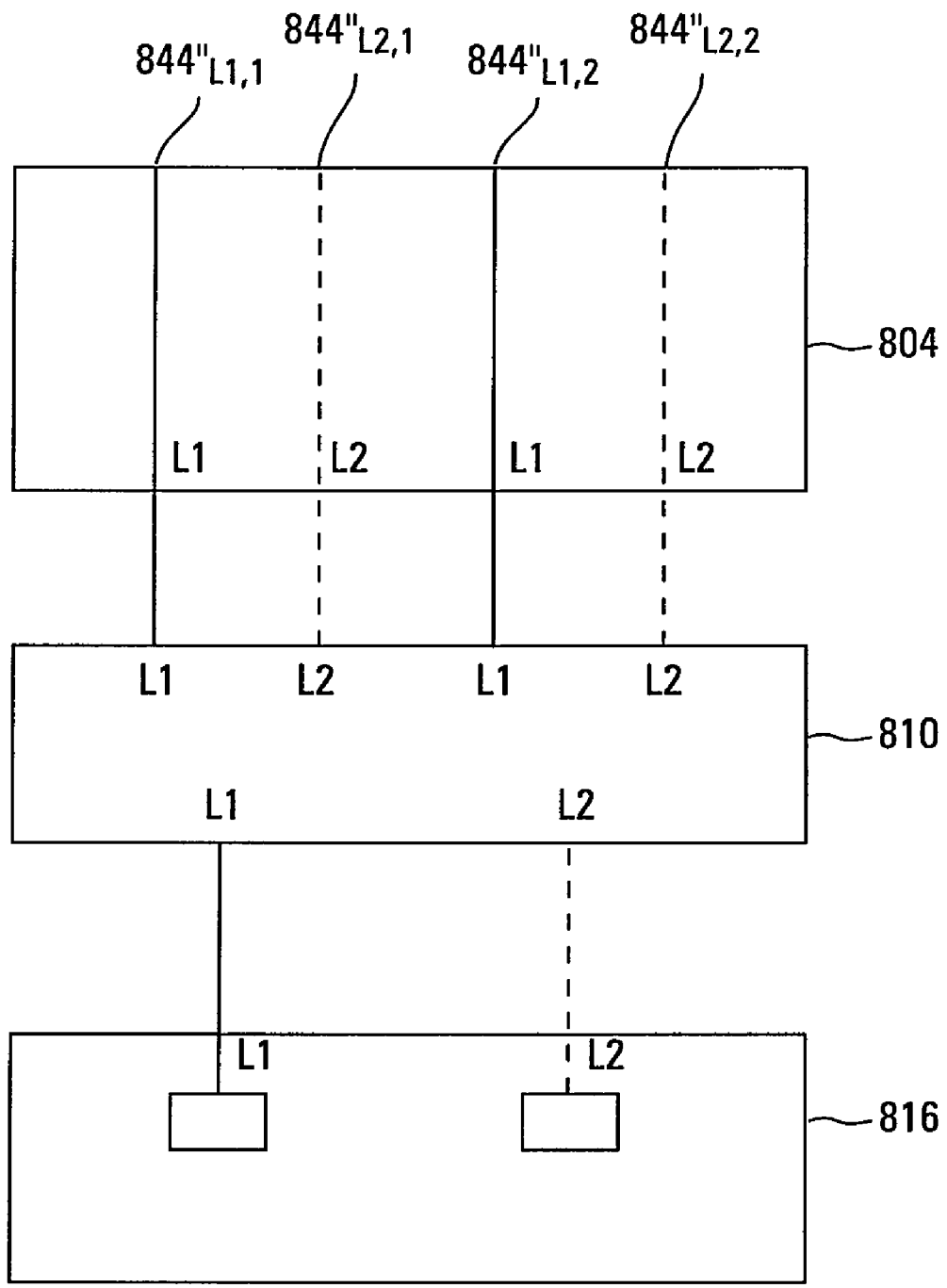
FIG. 8A illustrates a portion of a memory device, according to another embodiment of the invention.

FIG. 8A illustrates a portion of a memory device, such as memory device 102 of FIG. 1, according to another embodiment of the invention. For one embodiment, a memory array 804 of FIG. 8A may include bit lines $844_{L1}$ located at a first vertical level of memory array 804 and bit lines $844_{L2}$ located at a second vertical level, different from the first vertical level, of memory array 804. For another embodiment, memory array may be configured as memory array 404' of FIGS. 4B and 4C or as memory array 404'' of FIGS. 4D and 4E. Successive bit lines $844_{L1,1}$, $844_{L2,1}$, $844_{L1,2}$, $844_{L2,2}$ respectively alternate between the first and second vertical levels as denoted by the "L1" and "L2" of their subscripts. A multiplexer 810 is coupled to bit lines 844. Successive outputs at the first and second vertical levels of multiplexer 810 are alternately coupled between inputs formed at the first vertical level L1 and inputs formed at the second vertical level L2 of a sensing device 816.

Figure 8B:
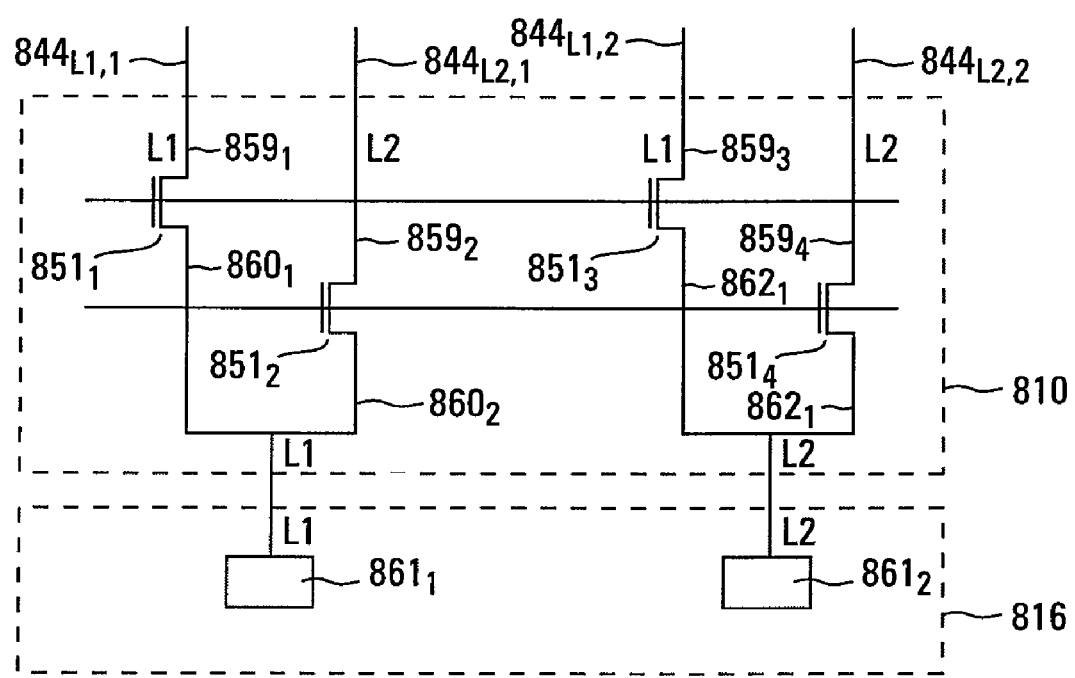
FIG. 8B is a schematic diagram of a multiplexer coupled to sensing device, according to another embodiment of the invention.
Figure 9:
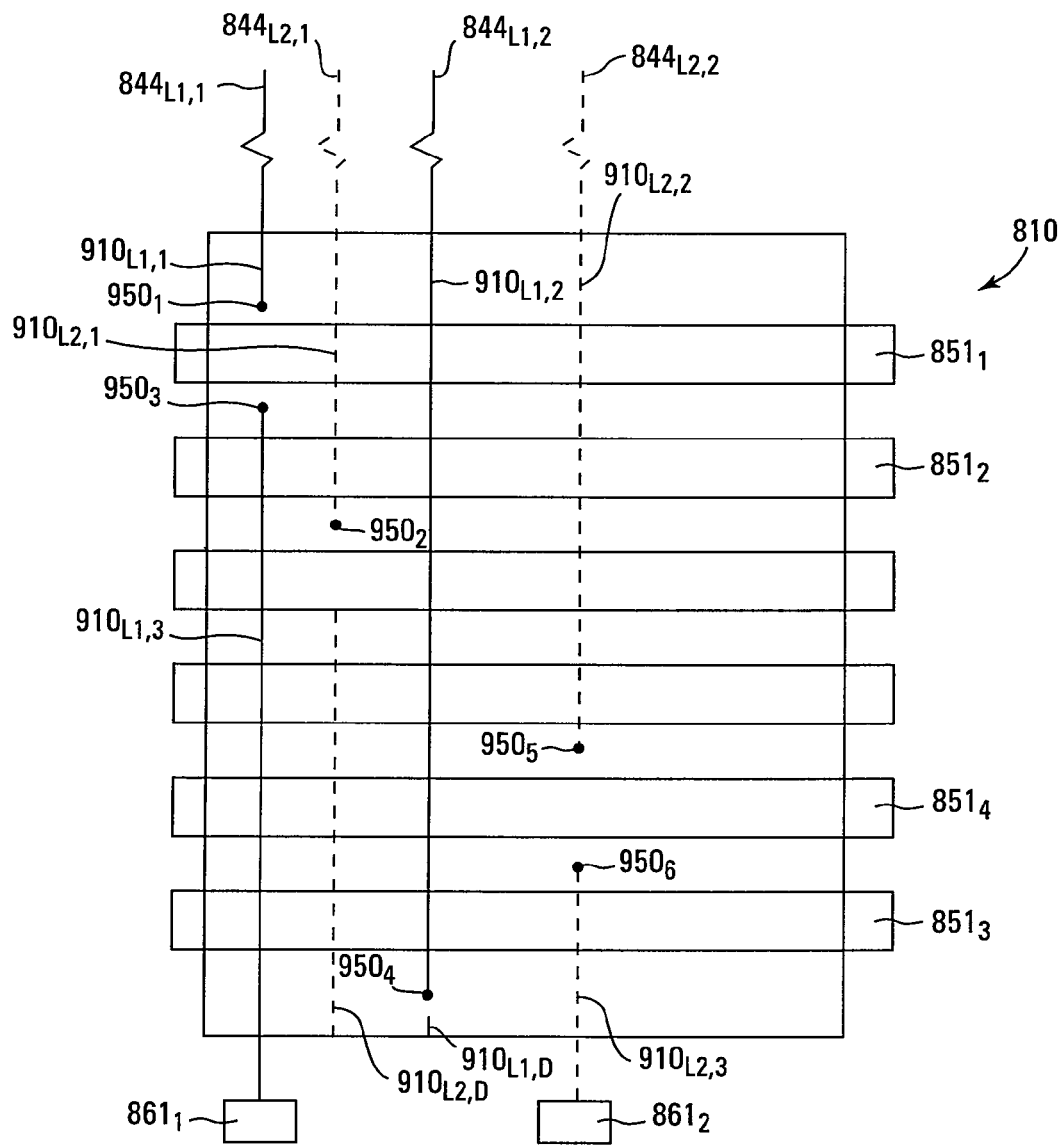
FIG. 9 is a plan view of a multiplexer, according to another embodiment of the invention.

FIG. 8B is a schematic diagram of multiplexer 810 coupled to sensing device 816, according to another embodiment of the invention. Successive bit lines $844_{L1,1}$, $844_{L2,1}$, $844_{L1,2}$, $844_{L2,2}$ are respectively alternately coupled to a source/drain region $859_1$ of multiplexer gate $851_1$ by a wiring (or a metal) layer located at the first vertical level L1, a source/drain region $859_2$ of multiplexer gate $851_2$ by a wiring (or a metal) layer located at the second vertical level L2, a source/drain region $859_3$ of multiplexer gate $851_3$ by a wiring (or a metal) layer located at the first vertical level L1, and a source/drain region $859_4$ of multiplexer gate $851_4$ by a wiring (or a metal) layer located at the second vertical level L2. Source/drain regions 860 of multiplexer gates $851_1$ and $851_2$ are coupled together and are coupled to sensing circuit $861_1$, located at the first vertical level L1, by the wiring (or a metal) layer located at the first vertical level L1 of multiplexer 810. Source/drain regions 862 of multiplexer gates $851_3$ and $851_4$ are coupled together and are coupled to sensing circuit $861_2$, located at the second vertical level L2, by the wiring (or a metal) layer located at the second vertical level L2 of multiplexer 810. For one embodiment, multiplexer gates 851 are high-voltage multiplexer gates, e.g., that may receive voltages of about 20 volts FIG. 9 is a plan view of multiplexer 810, according to another embodiment of the invention. The wiring (or metal) layer located at the first vertical level L1 defines lines $910_{L1,1}$, $910_{L1,2}$, and $910_{L1,3}$ and an optional "dummy" line $910_{L1,D}$, where the "L1" of the subscript denotes the first vertical level, and the wiring (or metal) layer located at the second vertical level L2 defines lines $910_{L2,1}$, $910_{L2,2}$, and $910_{L2,3}$ and an optional "dummy" line $910_{L2,D}$, where the "L2" of the subscript denotes the second vertical level. Note that for some embodiments, the wiring layers at the first and second levels may be respectively portions of wiring (or metal) layers at the first and second vertical levels of the memory array that respectively define the bit lines formed at those levels. Successive lines $910_{L1,1}$, $910_{L2,1}$, $910_{L1,2}$, and $910_{L2,2}$ respectively alternate between first vertical level L1, second vertical level L2, first vertical level L1, and second vertical level L2. Bit lines $844_{L1,1}$, $844_{L2,1}$, $844_{L1,2}$, and $844_{L2,2}$ are respectively coupled to lines $910_{L1,1}$, $910_{L2,1}$, $910_{L1,2}$, and $910_{L2,2}$. Note that for some embodiments, lines $910_{L1,1}$, $910_{L2,1}$, $910_{L1,2}$, and $910_{L2,2}$ are respectively extensions or portions of bit lines $844_{L1,1}$, $844_{L2,1}$, $844_{L1,2}$, and $844_{L2,2}$.

Line $910_{L1,1}$ couples bit line $844_{L1,1}$ to a contact $950_1$ that in turn couples line $910_{L1,1}$ to the source/drain region of multiplexer gate $851_1$. Line $910_{L2,1}$ couples bit line $844_{L2,1}$ to a contact $950_2$ that in turn couples line $910_{L2,1}$ to the source/drain region of multiplexer gate $851_2$. A contact $950_3$ is coupled to the coupled-together (or shared) source/drain regions of gates $851_1$ and $851_2$. Line $910_{L1,3}$ couples contact $950_3$ to sensing circuit $861_1$. Line $910_{L1,2}$ couples bit line $844_{L1,2}$ to a contact $950_4$ that in turn couples line $910_{L1,2}$ to a source/drain region of multiplexer gate $851_3$. Line $910_{L2,2}$ couples bit line $844_{L2,2}$ to a contact $950_5$ that in turn couples line $910_{L2,2}$ to a source/drain region of multiplexer gate $851_4$. A contact $950_6$ is coupled to the coupled-together (or shared) source/drain regions of gates $851_3$ and $851_4$. Line $910_{L2,3}$ couples contact $950_6$ to sensing circuit $861_2$.

Figure 10:
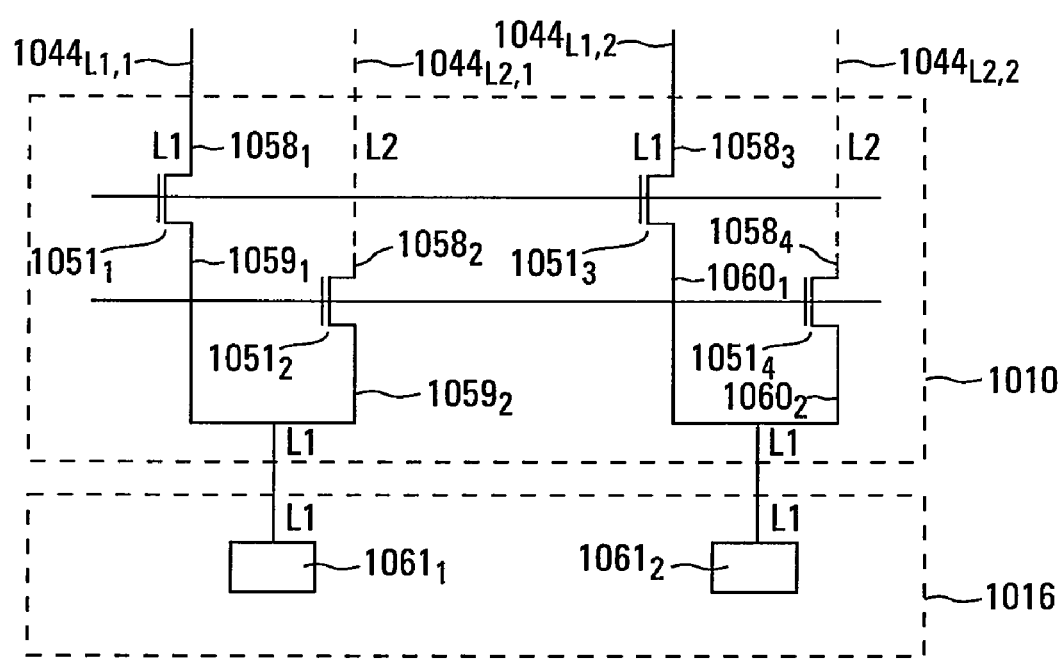
FIG. 10 is a schematic diagram of a multiplexer coupled to a sensing device, according to another embodiment of the invention.

FIG. 10 is a schematic diagram of a multiplexer 1010 coupled to a sensing device 1016, according to another embodiment of the invention. Successive bit lines $1044_{L1,1}$, $1044_{L2,1}$, $1044_{L1,2}$, $1044_{L2,2}$ respectively alternate between the first and second vertical levels as denoted by the "L1" and "L2" of their subscripts. Successive bit lines $1044_{L1,1}$, $1044_{L2,1}$, $1044_{L1,2}$, $1044_{L2,2}$ are respectively alternately coupled to a source/drain region $1058_1$ of multiplexer gate $1051_1$ by a wiring (or a metal) layer located at the first vertical level L1, a source/drain region $1058_2$ of multiplexer gate $1051_2$ by a wiring (or a metal) layer located at the second vertical level L2, a source/drain region $1058_3$ of multiplexer gate $1051_3$ by a wiring (or a metal) layer located at the first vertical level L1, and a source/drain region $1058_4$ of multiplexer gate $1051_4$ by a wiring (or a metal) layer located at the second vertical level L2. Source/drain regions 1059 of multiplexer gates $1051_1$ and $1051_2$ are coupled together and are coupled to sensing circuit $1061_1$, located at the first vertical level L1, by the wiring (or a metal) layer located at the first vertical level L1 of multiplexer 1010. Source/drain regions 1060 of multiplexer gates multiplexer gates $1051_3$ and $1051_4$ are coupled together and are coupled to sensing circuit $1061_2$, located at the first vertical level L1, by the wiring (or a metal) layer located at the first vertical level L1 of multiplexer 1010. For one embodiment, multiplexer gates 1051 are high-voltage multiplexer gates, e.g., that may receive voltages of about 20 volts.

Figure 11:
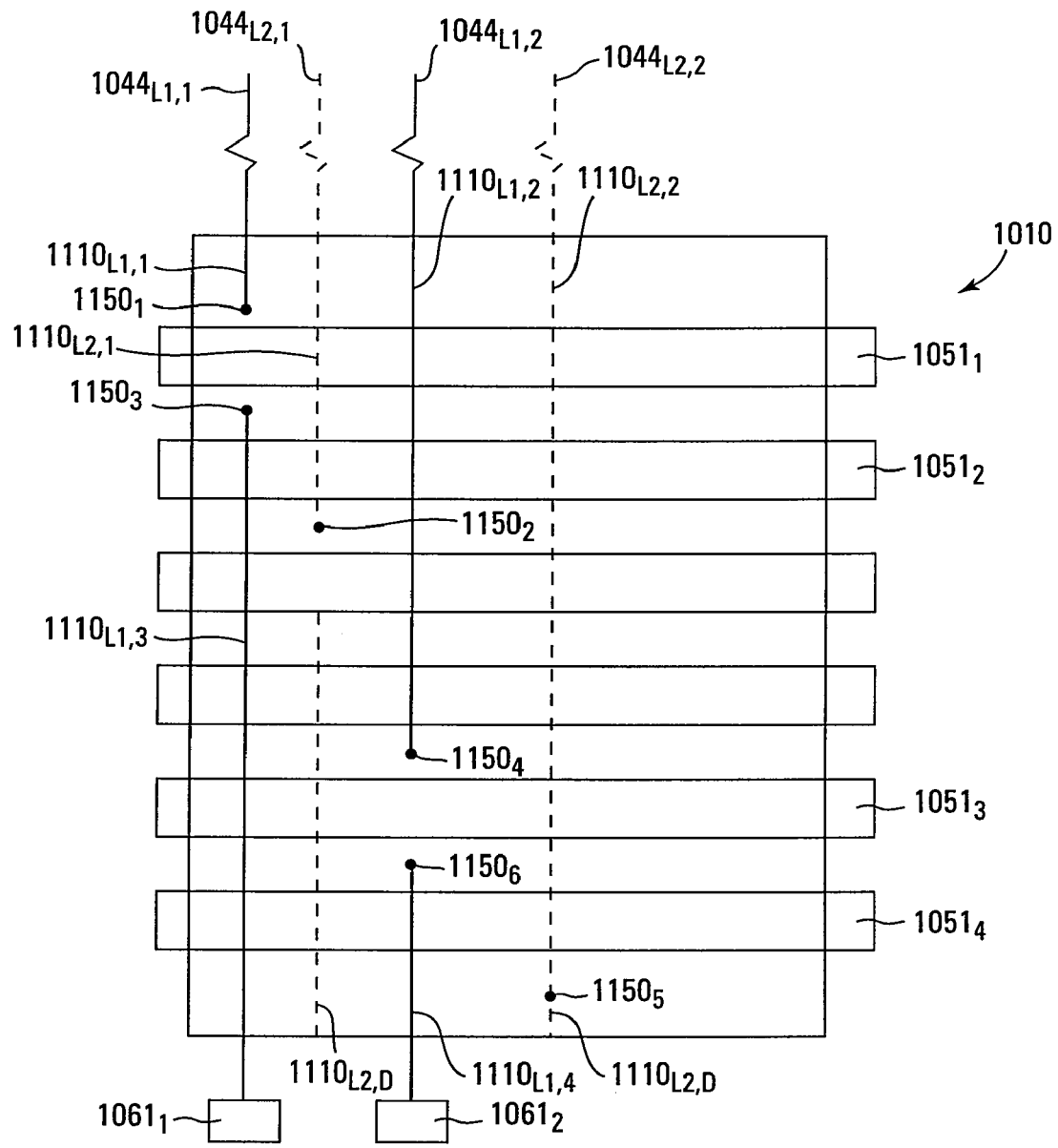
FIG. 11 is a plan view of a multiplexer, according to another embodiment of the invention.

FIG. 11 is a plan view of multiplexer 1010, according to another embodiment of the invention. The wiring (or metal) layer located at the first vertical level L1 includes lines $1110_{L1,1}$, $1110_{L1,2}$, $1110_{L1,3}$, and $1110_{L1,4}$, where the "L1" of the subscript denotes the first vertical level, and the wiring (or metal) layer located at the second vertical level L2 includes lines $1110_{L2,1}$ and $1110_{L2,2}$ and optional "dummy" lines $1110_{L2,D}$, where the "L2" of the subscript denotes the second vertical level. Successive lines $1110_{L1,1}$, $1110_{L2,1}$, $1110_{L1,2}$, and $1110_{L2,2}$ respectively alternate between first vertical level L1, second vertical level L2, first vertical level L1, and second vertical level L2. Note that for some embodiments, the wiring layers at the first and second levels may be respectively portions of wiring (or metal) layers at the first and second vertical levels of the memory array that respectively define the bit lines formed at those levels. Bit lines $1044_{L1,1}$, $1044_{L2,1}$, $1044_{L1,2}$, and $1044_{L2,2}$ are respectively coupled to lines $1110_{L1,1}$, $1110_{L2,1}$, $1110_{L1,2}$, and $1110_{L2,2}$. Note further that for some embodiments, lines $1110_{L1,1}$, $1110_{L2,1}$, $1110_{L1,2}$, and $1110_{L2,2}$ are respectively extensions or portions of bit lines $1044_{L1,1}$, $1044_{L2,1}$, $1044_{L1,2}$, and $1044_{L2,2}$.

Line $1110_{L1,1}$ couples bit line $1044_{L1,1}$ to a contact $1150_1$ that in turn couples line $1110_{L1,1}$ to a source/drain region of multiplexer gate $1051_1$. Line $1110_{L2,1}$ couples bit line $1044_{L2,1}$ to a contact $1150_2$ that in turn couples line $1110_{L2,1}$ to a source/drain region of multiplexer gate $1051_2$. A contact $1150_3$ is coupled to the coupled-together (or shared) source/drain regions of gates $1051_1$ and $1051_2$. Line $1110_{L1,3}$ couples contact $1150_3$ to sensing circuit $1061_1$. Line $1110_{L1,2}$ couples bit line $1044_{L1,2}$ to a contact $1150_4$ that in turn couples line $1110_{L1,2}$ to a source/drain region of multiplexer gate $1051_3$. Line $1110_{L2,2}$ couples bit line $1044_{L2,2}$ to a contact $1150_5$ that in turn couples line $1110_{L2,2}$ to a source/drain region of multiplexer gate $1051_4$. A contact $1150_6$ is coupled to the coupled-together (or shared) source/drain regions of gates $1051_3$ and $1051_4$. Line $1110_{L1,4}$ couples contact $1150_6$ to sensing circuit $1161_2$.

Figure 12:
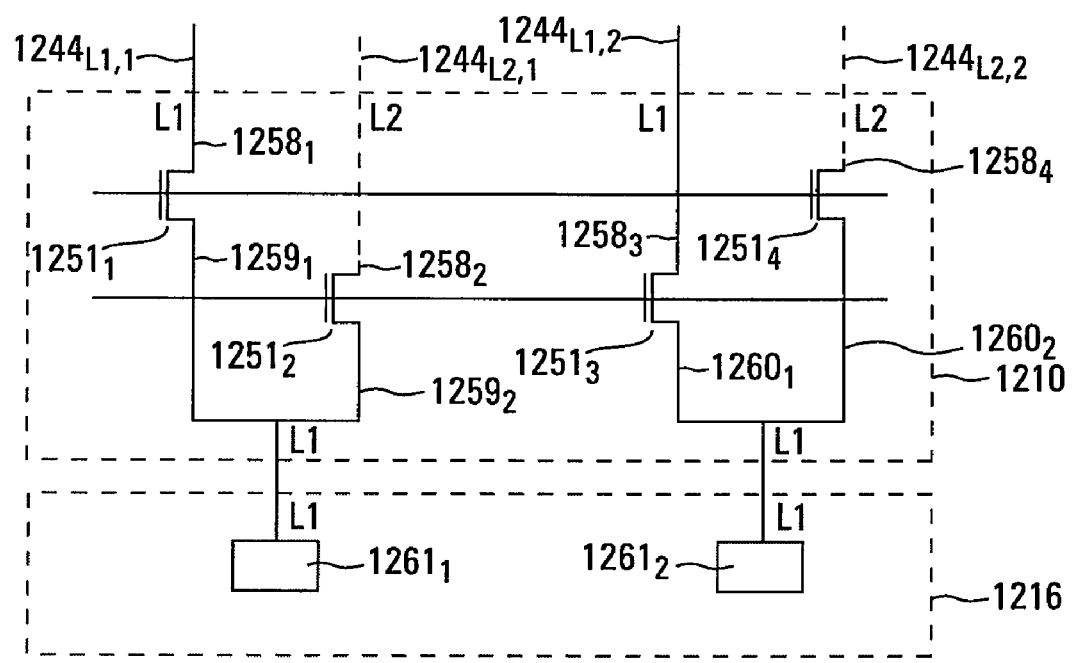
FIG. 12 is a schematic diagram of a multiplexer coupled to a sensing device, according to another embodiment of the invention.

FIG. 12 is a schematic diagram of a multiplexer 1210 coupled to a sensing device 1216, according to another embodiment of the invention. Successive bit lines $1244_{L1,1}$, $1244_{L2,1}$, $1244_{L1,2}$, $1244_{L2,2}$ respectively alternate between the first and second vertical levels as denoted by the "L1" and "L2" of their subscripts. Successive bit lines $1244_{L1,1}$, $1244_{L2,1}$, $1244_{L1,2}$, $1244_{L2,2}$ are respectively alternately coupled to a source/drain region $1258_1$ of multiplexer gate $1251_1$ by a wiring (or a metal) layer located at the first vertical level L1, a source/drain region $1258_2$ of multiplexer gate $1251_2$ by a wiring (or a metal) layer located at the second vertical level L2, a source/drain region $1258_3$ of multiplexer gate $1251_3$ by a wiring (or a metal) layer located at the first vertical level L1, and a source/drain region $1258_4$ of multiplexer gate $1251_4$ by a wiring (or a metal) layer located at the second vertical level L2. Source/drain regions 1259 of multiplexer gates $1251_1$ and $1251_2$ are coupled together and are coupled to sensing circuit $1261_1$, located at the first vertical level L1, by the wiring (or a metal) layer located at the first vertical level L1 of multiplexer 1210. Source/drain regions 1260 of multiplexer gates multiplexer gates $1251_3$ and $1251_4$ are coupled together and are coupled to sensing circuit $1261_2$, located at the first vertical level L1, by the wiring (or a metal) layer located at the first vertical level L1 of multiplexer 1210. Alternatively, for another embodiment, source/drain regions 1260 of multiplexer gates $1251_3$ and $1251_4$ may be coupled to a sensing circuit $1261_2$ located at the second vertical level L2 by a wiring (or a metal) layer located at the second vertical level L2 of multiplexer 1210 (not shown in FIG. 12). For one embodiment, multiplexer gates 1251 are high-voltage multiplexer gates, e.g., that may receive voltages of about 20 volts.

Figure 13:
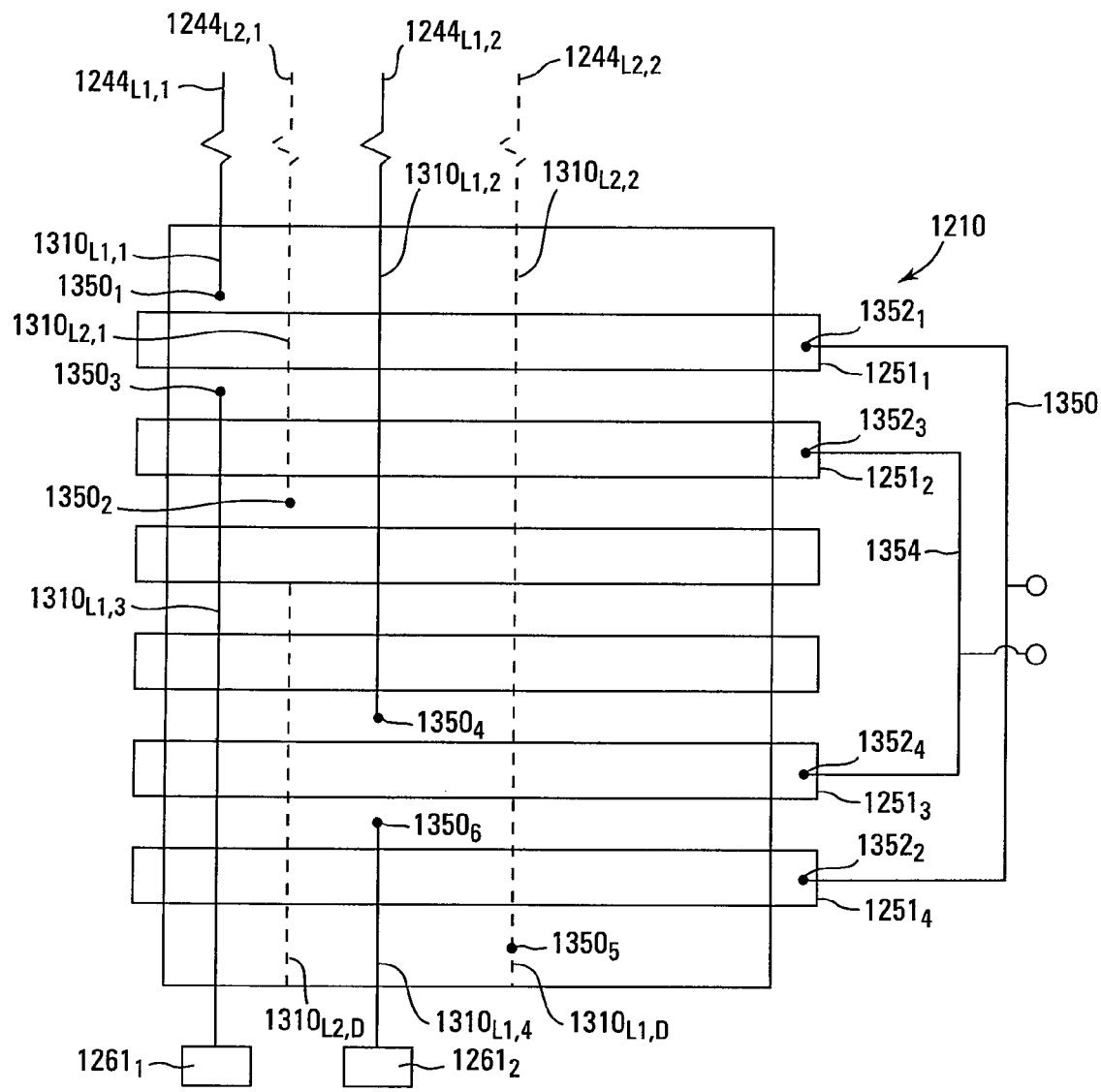
FIG. 13 is a plan view of multiplexer, according to another embodiment of the invention.
Figure 14:
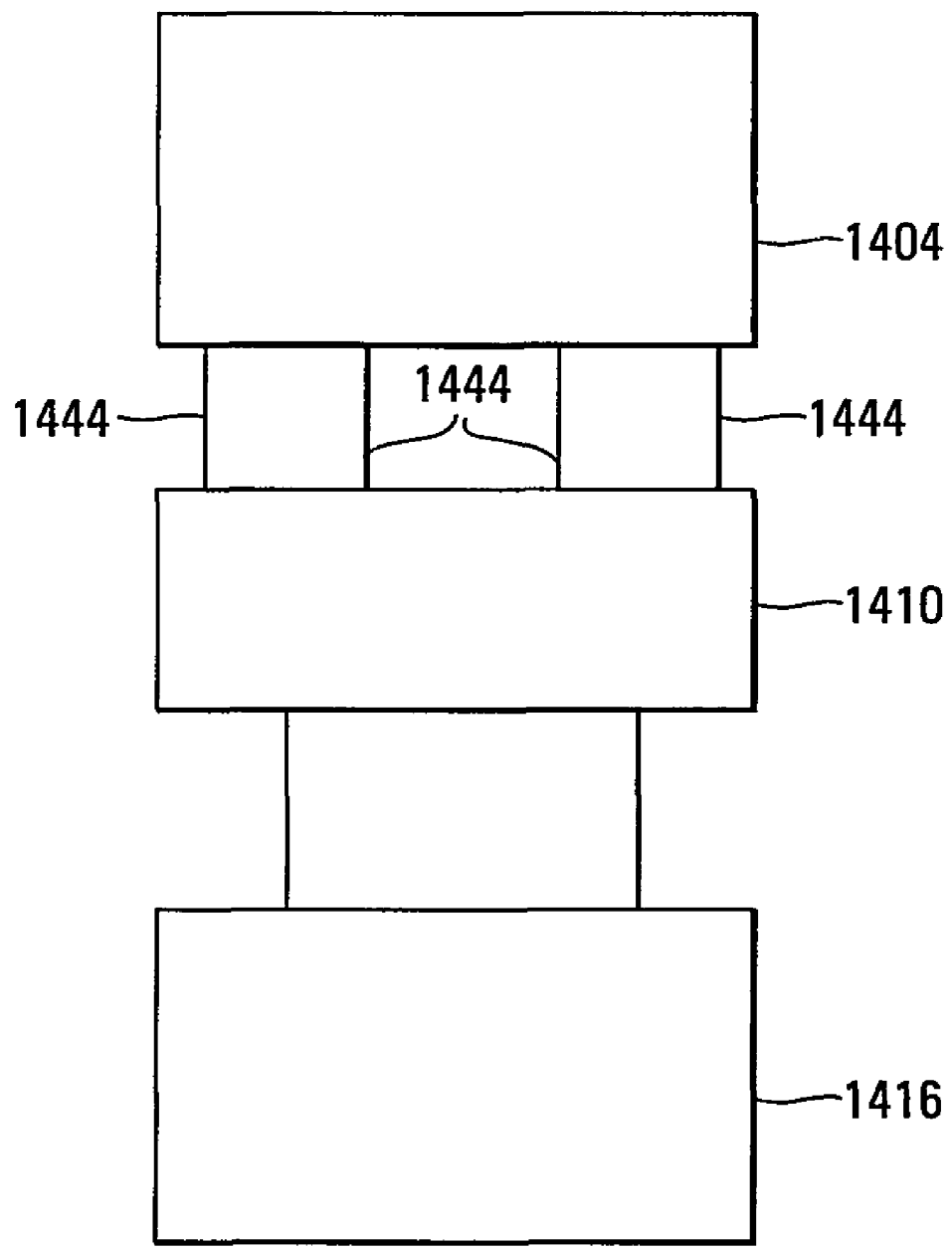
FIG. 14 illustrates a portion of a memory device of the prior art.
Figure 15:
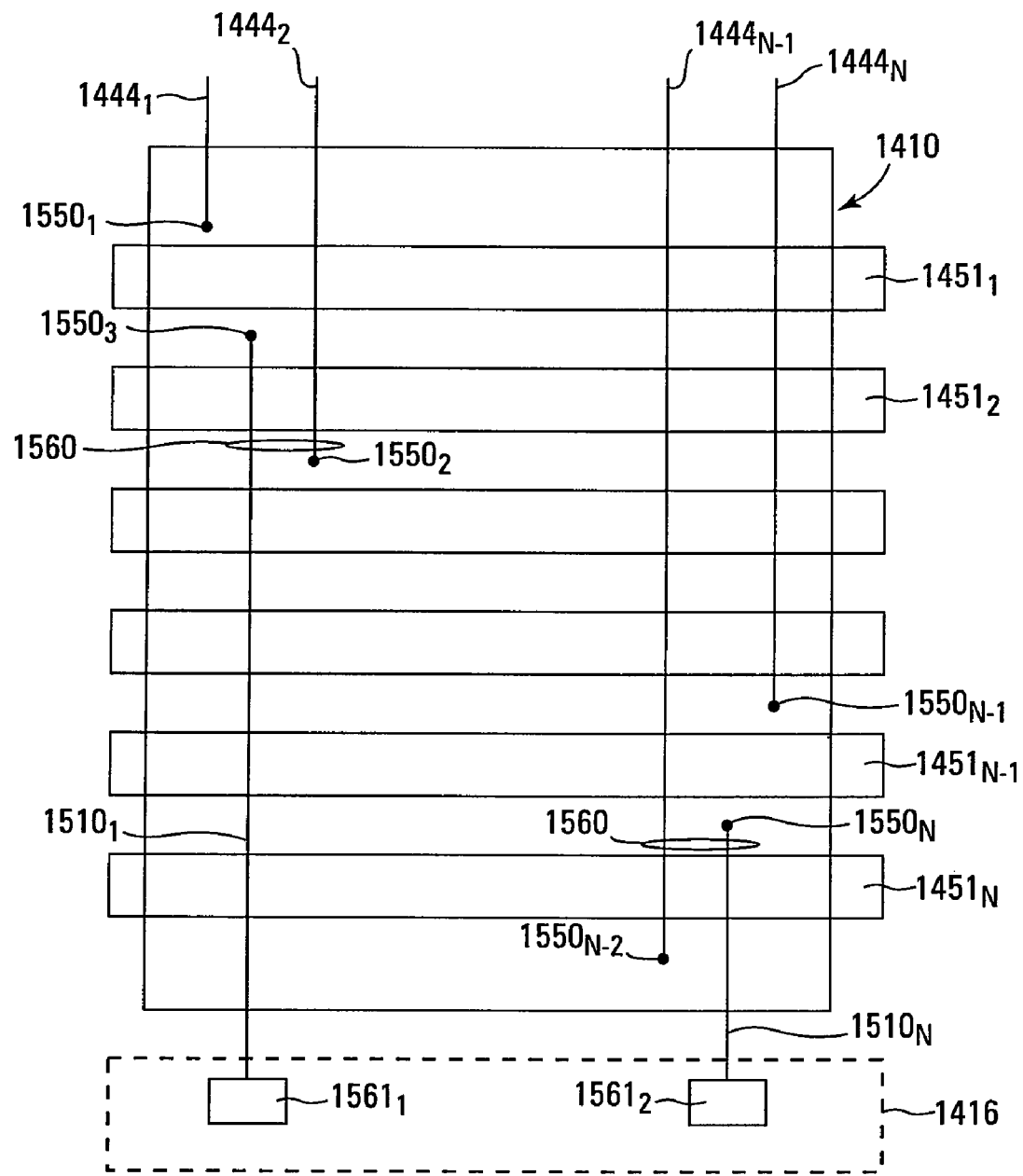
FIG. 15 is a plan view of a multiplexer of the prior art.

FIG. 13 is a plan view of multiplexer 1210, according to another embodiment of the invention. The wiring (or metal) layer located at the first vertical level L1 includes lines $1310_{L1,1}$, $1310_{L1,2}$, $1310_{L1,3}$, and $1310_{L1,4}$, where the "L1" of the subscript denotes the first vertical level, and the wiring (or metal) layer located at the second vertical level L2 includes lines $1310_{L2,1}$ and $1310_{L2,2}$ and optional "dummy" lines $1310_{L2,D}$, where the "L2" of the subscript denotes the second vertical level. Successive lines $1310_{L1,1}$, $1310_{L2,1}$, $1310_{L1,2}$, and $1310_{L2,2}$ respectively alternate between first vertical level L1, second vertical level L2, first vertical level L1, and second vertical level L2. Note that for some embodiments, the wiring layers at the first and second levels may be respectively portions of wiring (or metal) layers at the first and second vertical levels of the memory array that respectively define the bit lines formed at those levels. Bit lines $1244_{L1,1}$, $1244_{L2,1}$, $1244_{L1,2}$, and $1244_{L2,2}$ are respectively coupled to lines $1310_{L1,1}$, $1310_{L2,1}$, $1310_{L1,2}$, and $1310_{L2,2}$. Note further that for some embodiments, lines $1310_{L1,1}$, $1310_{L2,1}$, $1310_{L1,2}$, and $1310_{L2,2}$ are respectively extensions or portions of bit lines $1244_{L1,1}$, $1244_{L2,1}$, $1244_{L1,2}$, and $1244_{L2,2}$.

Line $1310_{L1,1}$ couples bit line $1244_{L1,1}$ to a contact $1350_1$ that in turn couples line $1310_{L1,1}$ to a first source/drain region of multiplexer gate $1251_1$. Line $1310_{L2,1}$ couples bit line $1244_{L2,1}$ to a contact $1350_2$ that in turn couples line $1310_{L2,1}$ to a first source/drain region of multiplexer gate $1251_2$. A contact $1350_3$ is coupled to coupled-together (or shared) second source/drain regions of gates $1251_1$ and $1251_2$. Line $1310_{L1,3}$ couples contact $1350_3$ to sensing circuit $1261_1$. Line $1310_{L1,2}$ couples bit line $1244_{L1,2}$ to a contact $1350_4$ that in turn couples line $1310_{L1,2}$ to a first source/drain region of multiplexer gate $1251_3$. Line $1310_{L2,2}$ couples bit line $1244_{L2,2}$ to a contact $1350_5$ that in turn couples line $1310_{L2,2}$ to a first source/drain region of multiplexer gate $1251_4$. A contact $1350_6$ is coupled to the coupled-together (or shared) second source/drain regions of gates $1251_3$ and $1251_4$. Line $1310_{L1,4}$ couples contact $1350_6$ to sensing circuit $1261_2$.

For one embodiment, a line 1350 that may be formed at either the first or second vertical levels couples multiplexer gates $1251_1$ and $1251_4$ together. For another embodiment, contacts (or via plugs) $1352_1$ and $1352_2$ respectively couple line 1350 to control gates of multiplexer gates $1251_1$ and $1251_4$. For another embodiment, a line 1354 that may be formed at either the first or second vertical levels couples multiplexer gates $1251_2$ and $1251_3$ together. For another embodiment, contacts (or via plugs) $1352_3$ and $1352_4$ respectively couple line 1354 to control gates of multiplexer gates $1251_2$ and $1251_3$.

Conclusion

Although specific embodiments have been illustrated and described herein, it will be appreciated by those of ordinary skill in the art that any arrangement that is calculated to achieve the same purpose may be substituted for the specific embodiments shown. Many adaptations of the invention will be apparent to those of ordinary skill in the art. Accordingly, this application is intended to cover any adaptations or variations of the invention. It is manifestly intended that this invention be limited only by the following claims and equivalents thereof.

What is claimed is:

1. A memory device, comprising:
 a first bit line coupled to a first source/drain region of a first multiplexer gate;
 a second bit line coupled to a first source/drain region of a second multiplexer gate; and
 a sensing device comprising an input coupled to a second source/drain region of the first multiplexer gate and a second source/drain region of the second multiplexer gate;
 wherein the input of the sensing device is formed at a vertical level that is different than a vertical level at which only one of the first and second bit lines is formed; and
 wherein the second source/drain region of the first multiplexer gate and the second source/drain region of the second multiplexer gate form a source/drain region that is common to the first and second multiplexer gates.

2. The memory device of claim 1, wherein the first bit line is selectively coupled to the input of the sensing device through the first multiplexer gate and the second bit line is selectively coupled to the input of the sensing device through the second multiplexer gate.

3. A memory device, comprising:
 a first bit line coupled to a first source/drain region of a first multiplexer gate;
 a second bit line coupled to a first source/drain region of a second multiplexer gate;
 a sensing device comprising an input coupled to a second source/drain region of the first multiplexer gate and a second source/drain region of the second multiplexer gate; and
 dummy lines formed at respectively the same vertical levels as the first and second bit lines and respectively corresponding to the first and second bit lines;
 wherein the input of the sensing device is formed at a vertical level that is different than a vertical level at which at least one of the first and second bit lines is formed.

4. A memory device, comprising:
 a first bit line coupled to a first source/drain region of a first multiplexer gate;
 a second bit line coupled to a first source/drain region of a second multiplexer gate;
 a sensing device comprising an input coupled to a second source/drain region of the first multiplexer gate and a second source/drain region of the second multiplexer gate;
 a first contact coupled to the first bit line and the first source/drain region of the first multiplexer gate;
 a second contact coupled to the second bit line and the first source/drain region of the second multiplexer gate;
 a third line formed at the same vertical level as the input to the sensing device and coupled to the input of the sensing device; and
 a third contact coupled to the third line and the second source/drain regions of the first and second multiplexer gates;
 wherein the input of the sensing device is formed at a vertical level that is different than a vertical level at which at least one of the first and second bit lines is formed.

5. The memory device of claim 4, wherein the first source/drain region of the first multiplexer gate, the first source/drain region of the second multiplexer gate, and the second source/drain regions of the first and second multiplexer gates are formed at a vertical level that is different than the vertical level at which the input of the sensing device is formed and different than the vertical level at which the at least one of the first and second bit lines is formed.

6. A memory device, comprising:
 a first bit line selectively coupled to an input of a sensing device through a first multiplexer gate; and
 a second bit line selectively coupled to the input of the sensing device through a second multiplexer gate;
 wherein the first bit line is formed at a first vertical layer and is coupled to a first source/drain region of the first multiplexer gate;
 wherein the input of the sensing device is formed at a second vertical layer different than the first vertical layer and is coupled to a second source/drain region of the first multiplexer gate and a first source/drain region of the second multiplexer gate;
 wherein the second bit line is formed at the first vertical layer and is coupled to a second source/drain region of the second multiplexer gate; and
 wherein the first and second source/drain regions of the first and second multiplexer gates are located at a third vertical level different than the first and second vertical levels.

7. The memory device of claim 6, wherein first contacts extend between the first and third vertical levels to respectively couple the first bit line to the first source/drain region of the first multiplexer gate and the second bit line to the second source/drain region of the second multiplexer gate.

8. The memory device of claim 7, wherein a second contact extends between the second and third vertical levels to couple the input of the sensing device to the second source/drain region of the first multiplexer gate and the first source/drain region of the second multiplexer gate.

9. A memory device, comprising:
 a first bit line selectively coupled to an input of a first sensing device through a first multiplexer gate;
 a second bit line selectively coupled to the input of the first sensing device through a second multiplexer gate;
 a third bit line selectively coupled to an input of a second sensing device through a third multiplexer gate; and
 a fourth bit line selectively coupled to the input of the second sensing device through a fourth multiplexer gate;
 wherein the first bit line is formed at a first vertical layer and is coupled to a first source/drain region of the first multiplexer gate;
 wherein the input of the first sensing device is formed at a second vertical layer different than the first vertical layer and is coupled to a second source/drain region of the first multiplexer gate and a first source/drain region of the second multiplexer gate;
 wherein the third bit line is formed at the first vertical layer and is coupled to a first source/drain region of the third multiplexer gate;
 wherein the input of the second sensing device is formed at the second vertical layer and is coupled to a second source/drain region of the third multiplexer gate and a first source/drain region of the fourth multiplexer gate;

wherein the second bit line is formed at the second vertical layer and is coupled to a second source/drain region of the second multiplexer gate; and wherein the fourth bit line is formed at the second vertical layer and is coupled to a second source/drain region of the fourth multiplexer gate.

10. The memory device of claim 9, wherein the first and second source/drain regions of the first, second, third, and fourth multiplexer gates are located at a third vertical level different than the first and second vertical levels.

11. The memory device of claim 10, wherein first contacts extend between the first and third vertical levels to respectively couple the first bit line to the first source/drain region of the first multiplexer gate, the third bit line to the first source/drain region of the third multiplexer gate, the input of the second sensing device to the second source/drain region of the third multiplexer gate and the first source/drain region of the fourth multiplexer gate, and the input of the first sensing device to the second source/drain region of the first multiplexer gate and the first source/drain region of the second multiplexer gate.

12. The memory device of claim 11, wherein second contacts extend between the second and third vertical levels to respectively couple the second bit line to the second source/drain region of the second multiplexer gate and the fourth bit line to the second source/drain region of the fourth multiplexer gate.

13. A memory device, comprising:
a first bit line selectively coupled to an input of a first sensing device through a first multiplexer gate;
a second bit line selectively coupled to the input of the first sensing device through a second multiplexer gate;
a third bit line selectively coupled to an input of a second sensing device through a third multiplexer gate; and
a fourth bit line selectively coupled to the input of the second sensing device through a fourth multiplexer gate;
wherein the first bit line is formed at a first vertical layer and is coupled to a first source/drain region of the first multiplexer gate;
wherein the input of the first sensing device is formed at a second vertical layer different than the first vertical layer and is coupled to a second source/drain region of the first multiplexer gate and a first source/drain region of the second multiplexer gate;
wherein the third bit line is formed at the second vertical layer and is coupled to a first source/drain region of the third multiplexer gate;
wherein the input of the second sensing device is formed at the first vertical layer and is coupled to a second source/drain region of the third multiplexer gate and a first source/drain region of the fourth multiplexer gate;
wherein the second bit line is formed at the first vertical layer and is coupled to a second source/drain region of the second multiplexer gate; and
wherein the fourth bit line is formed at the second vertical layer and is coupled to a second source/drain region of the fourth multiplexer gate.

14. The memory device of claim 13, wherein the first and second source/drain regions of the first, second, third, and fourth multiplexer gates are located at a third vertical level different than the first and second vertical levels.

15. The memory device of claim 14, wherein first contacts extend between the first and third vertical levels to respectively couple the first bit line to the first source/drain region of the first multiplexer gate, the second bit line to the second source/drain region of the second multiplexer gate, and the input of the second sensing device to the second source/drain region of the third multiplexer gate and the first source/drain region of the fourth multiplexer gate.

16. The memory device of claim 15, wherein second contacts extend between the second and third vertical levels to respectively couple the third bit line to the second source/drain region of the second multiplexer gate, the fourth bit line to the second source/drain region of the fourth multiplexer gate, and the input of the first sensing device to the second source/drain region of the first multiplexer gate and the first source/drain region of the second multiplexer gate.

17. A memory device, comprising:
a first wiring layer at a first vertical level, the first wiring layer defining first and second bit lines formed at the first vertical level;
a second wiring layer at a second vertical level different than the first vertical level, the second wiring layer coupled to an input of a sensing device formed at the second vertical level;
a first contact coupled between the first bit line of the first wiring layer and a first source/drain region of a first multiplexer gate, the first source/drain region formed at a third vertical level different from the first and second vertical levels;
a second contact coupled between the second bit line of the first wiring layer and a first source/drain region of a second multiplexer gate, the first source/drain region of the second multiplexer gate formed at the third vertical level; and
a third contact coupled between the second wiring layer and second source/drain regions of the first and second multiplexer gates, the second source/drain regions of the first and second multiplexer gates formed at the third vertical level.

18. A memory device, comprising:
a first wiring layer at a first vertical level, the first wiring layer defining first and second bit lines and a third line, the third line of the first wiring layer coupled to an input of a first sensing device formed at the first vertical level;
a second wiring layer at a second vertical level different than the first vertical level, the second wiring layer having first and second bit lines and a third line, the third line of the second wiring layer coupled to an input of a second sensing device formed at the second vertical level;
a first contact coupled between the first bit line of the first wiring layer and a first source/drain region of a first multiplexer gate, the first source/drain region formed at a third vertical level different from the first and second vertical levels;
a second contact coupled between the second bit line of the first wiring layer and a first source/drain region of a second multiplexer gate, the first source/drain region of the second multiplexer gate formed at the third vertical level;
a third contact coupled between the third line of the second wiring layer and second source/drain regions of the first and second multiplexer gates, the second source/drain regions of the first and second multiplexer gates formed at the third vertical level;
a fourth contact coupled between the first bit line of the second wiring layer and a first source/drain region of a third multiplexer gate, the first source/drain region of the third multiplexer gate formed at the third vertical level;
a fifth contact coupled between the second bit line of the second wiring layer and a first source/drain region of a fourth multiplexer gate, the first source/drain region of the fourth multiplexer gate formed at the third vertical level; and a sixth contact coupled between the third line of the first wiring layer and second source/drain regions of the third and fourth multiplexer gates, the second source/drain regions of the third and fourth multiplexer gates formed at the third vertical level.

19. A memory device, comprising:

a first wiring layer at a first vertical level, the first wiring layer defining first and second bit lines and third and fourth lines, the third and fourth lines of the first wiring layer respectively coupled to an input of a first sensing device formed at the first vertical level and an input of a second sensing device formed at the first vertical level;

a second wiring layer at a second vertical level different than the first vertical level, the second wiring layer having first and second bit lines;

a first contact coupled between the first bit line of the first wiring layer and a first source/drain region of a first multiplexer gate, the first source/drain region formed at a third vertical level different from the first and second vertical levels;

a second contact coupled between the first bit line of the second wiring layer and a first source/drain region of a second multiplexer gate, the first source/drain region of the second multiplexer gate formed at the third vertical level;

a third contact coupled between the third line of the first wiring layer and second source/drain regions of the first and second multiplexer gates, the second source/drain regions of the first and second multiplexer gates formed at the third vertical level;

a fourth contact coupled between the second bit line of the first wiring layer and a first source/drain region of a third multiplexer gate, the first source/drain region of the third multiplexer gate formed at the third vertical level;

a fifth contact coupled between the second bit line of the second wiring layer and a first source/drain region of a fourth multiplexer gate, the first source/drain region of the fourth multiplexer gate formed at the third vertical level; and a sixth contact coupled between the fourth line of the first wiring layer and second source/drain regions of the third and fourth multiplexer gates, the second source/drain regions of the third and fourth multiplexer gates formed at the third vertical level.

* * * * *